United States Patent
Yamada et al.

(10) Patent No.: US 7,067,198 B2
(45) Date of Patent: Jun. 27, 2006

(54) METHOD AND APPARATUS FOR PROCESSING THREE-DIMENSIONAL STRUCTURE, METHOD FOR PRODUCING THREE-DIMENSIONAL SHAPE PRODUCT AND THREE-DIMENSIONAL STRUCTURE

(75) Inventors: Yasufumi Yamada, Ohta-ku (JP); Katsumi Midorikawa, Wako (JP); Hiroshi Kumagai, Wako (JP)

(73) Assignees: Ricoh Company, Ltd., Tokyo (JP); RIKEN, Saitama (JP)

( * ) Notice: Subject to any disclaimer, the term of this patent is extended or adjusted under 35 U.S.C. 154(b) by 0 days.

(21) Appl. No.: 10/747,404

(22) Filed: Dec. 30, 2003

(65) Prior Publication Data

US 2004/0149705 A1    Aug. 5, 2004

Related U.S. Application Data

(62) Division of application No. 10/321,635, filed on Dec. 18, 2002, now Pat. No. 6,803,540.

(30) Foreign Application Priority Data

Dec. 18, 2001 (JP) .............................. 2001-385258

(51) Int. Cl.
*B22F 5/00* (2006.01)
*B23K 26/00* (2006.01)

(52) U.S. Cl. ...................... 428/600; 428/435; 428/601; 428/913; 219/121.6; 219/121.65; 219/121.76

(58) Field of Classification Search ................ 428/600, 428/601, 439, 913, 64.2; 219/121.6, 121.65, 219/121.76
See application file for complete search history.

(56) References Cited

U.S. PATENT DOCUMENTS

| | | | | |
|---|---|---|---|---|
| 4,476,375 A | | 10/1984 | Ogawa | |
| 4,969,141 A | * | 11/1990 | Takaoka et al. | 369/100 |
| 5,368,908 A | * | 11/1994 | Ohta et al. | 428/64.4 |
| 5,843,626 A | * | 12/1998 | Ohta et al. | 430/320 |
| 5,851,862 A | | 12/1998 | Ohtani et al. | |
| 6,133,583 A | | 10/2000 | Ohtani et al. | |
| 2001/0035401 A1 | | 11/2001 | Manor | |

FOREIGN PATENT DOCUMENTS

| | | |
|---|---|---|
| JP | 10-137953 | 5/1998 |
| JP | 10-223504 | 8/1998 |
| JP | 10-319221 | 12/1998 |

\* cited by examiner

*Primary Examiner*—Cathy F. Lam
(74) *Attorney, Agent, or Firm*—Oblon, Spivak, McClelland, Maier & Neustadt, P.C.

(57) ABSTRACT

Disclosed is a method for processing a three-dimensional structure having a fine three-dimensional shape and a smooth surface is disclosed in which the three-dimensional structure is usable for an optical device.

The process method comprises the steps of depositing a thin layer for absorption of laser light on a flat substrate; depositing a transparent layer on the thin layer for absorption of laser light; and irradiating a process laser light, passing through the transparent layer; in which pulse injection energy of the process laser light is set to be the same as or smaller than the maximum pulse injection energy capable of exposing a surface of the thin layer in front in the incident direction of the process laser light, and to be set the same as or greater than the minimum pulse injection energy capable of removing the transparent layer in rear in the incident direction of the process laser light.

4 Claims, 19 Drawing Sheets

FIG. 4
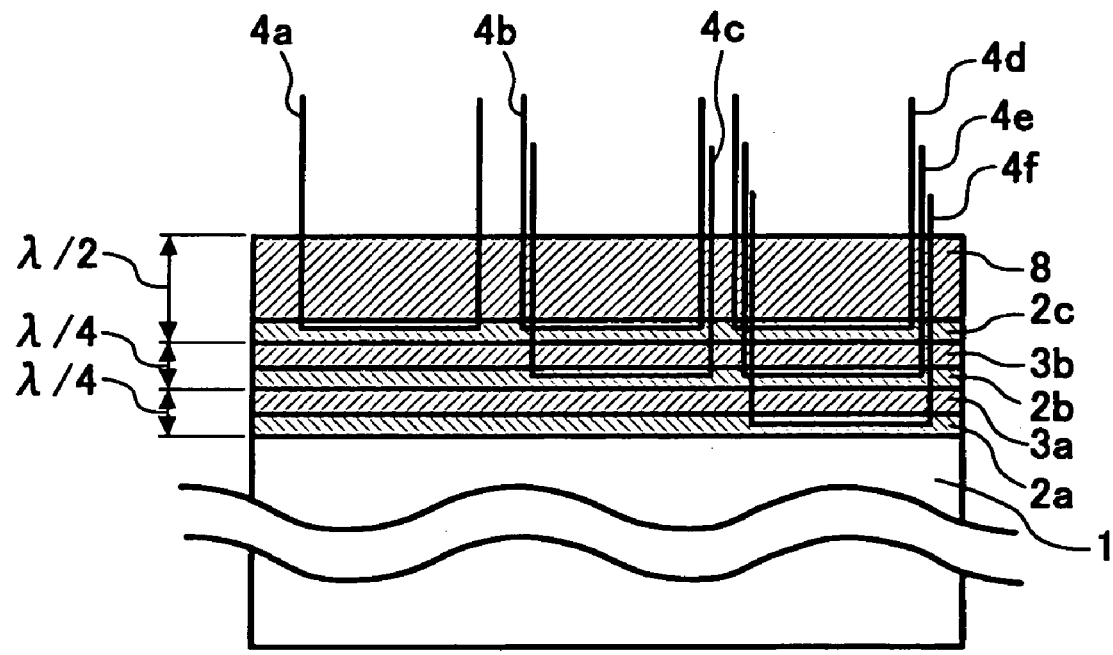
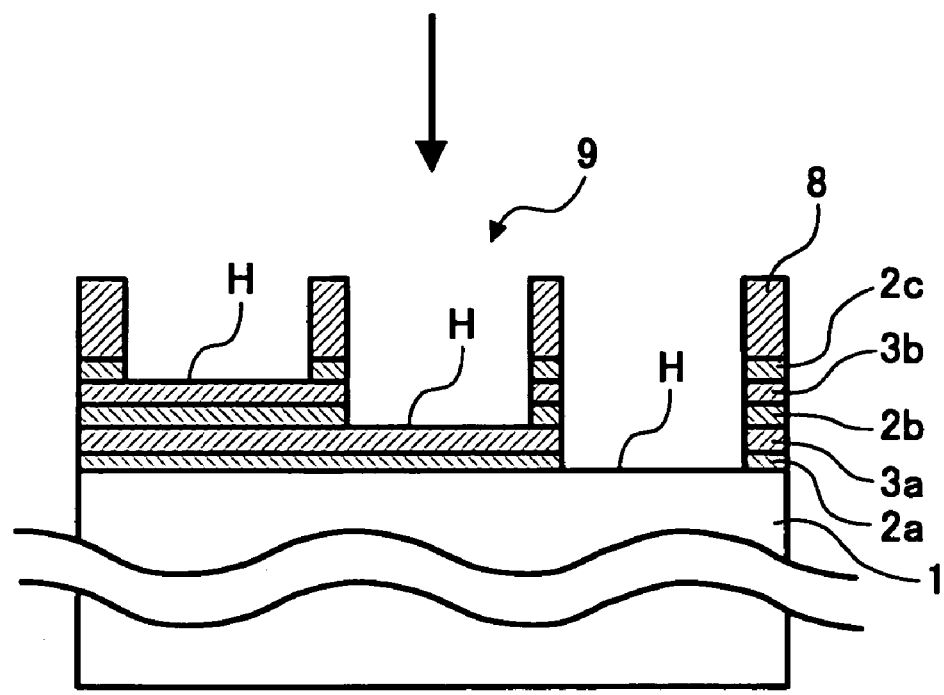

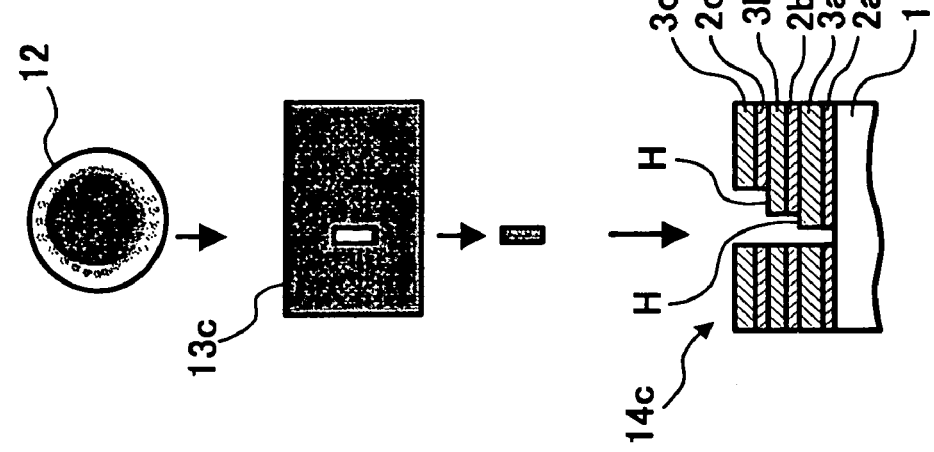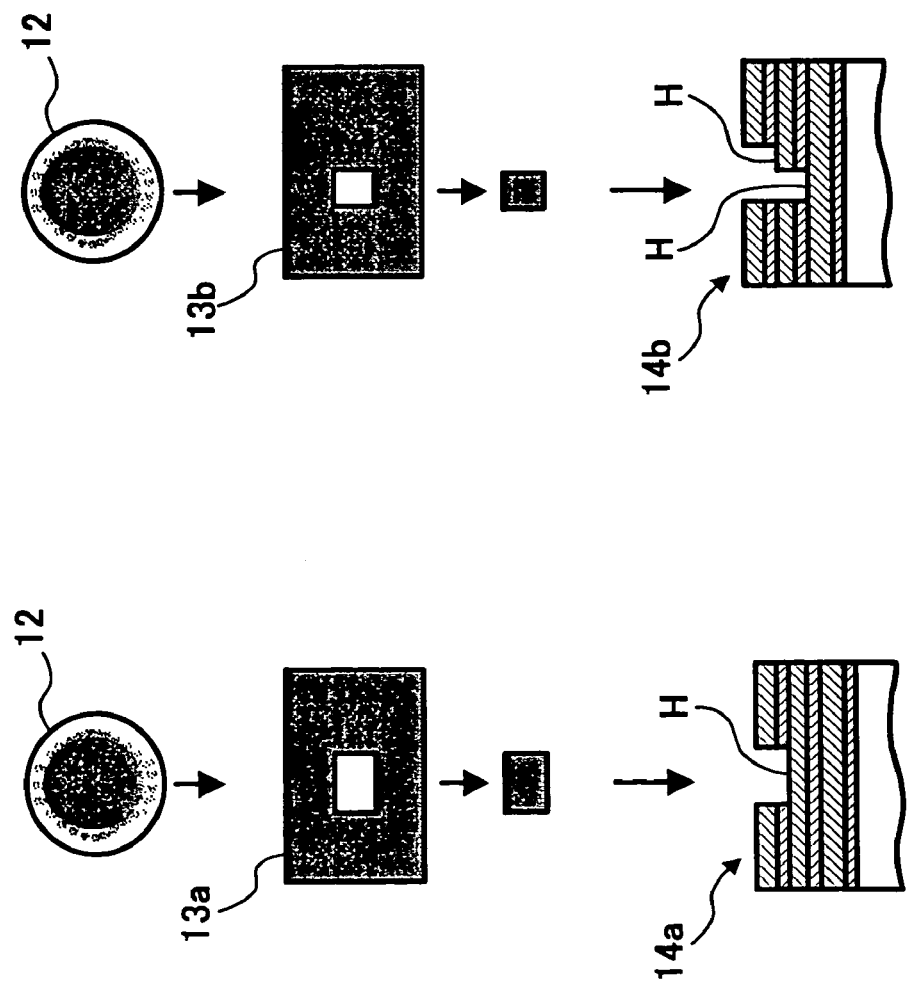

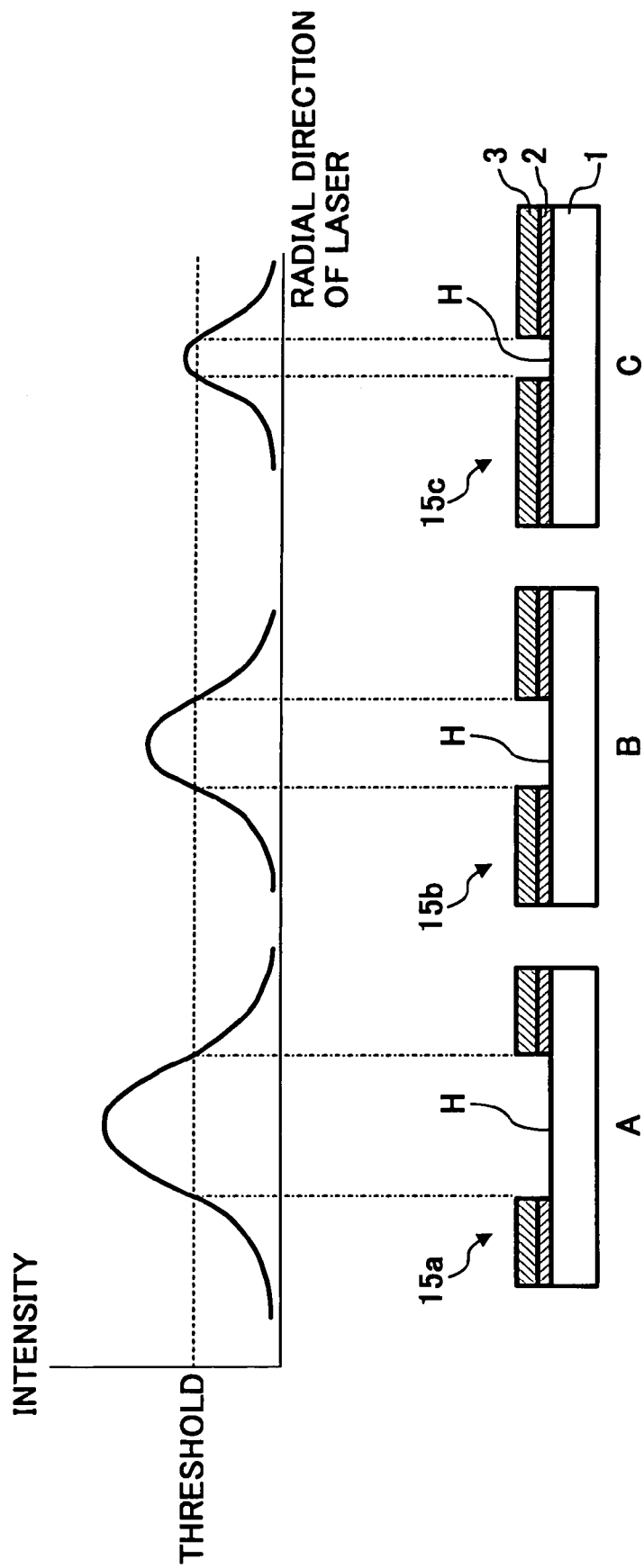

METHOD AND APPARATUS FOR PROCESSING THREE-DIMENSIONAL STRUCTURE, METHOD FOR PRODUCING THREE-DIMENSIONAL SHAPE PRODUCT AND THREE-DIMENSIONAL STRUCTURE

This application is a divisional of U.S. patent application Ser. No. 10/321,635, filed on Dec. 18, 2002, now U.S. Pat. No. 6,803,540.

BACKGROUND OF THE INVENTION

1. Field of the Invention

The present invention relates to a method and an apparatus for processing a three-dimensional structure, a method for producing a product having a three-dimensional shape, and a three-dimensional structure, wherein a fine structure can be formed directly on a material to be processed by irradiating a laser beam, and more specifically to a method and an apparatus for processing a three-dimensional structure, a method for producing a product having a three-dimensional shape, and a three-dimensional structure, wherein a three-dimensional structure with a smooth flat bottom surface can be formed in a high controllability with respect to the process, using one-shot laser light pulses.

In particular, the object of the present invention is to produce in a high precision a product which requires to form a very fine structure, and thereby the present invention relates to a product having a fine three-dimensional shape, in which case, a method for forming recording pits in an optical disk, a method for forming a stamper for producing an original or master form for such an optical disk, a method for forming an optical element, such as a multi-level diffraction grating, a diffraction hologram, or the like, a method for forming an original or master form of such an optical element, and/or a method for processing a three-dimensional structure in a micro-machine, micro-sensor or the like, for processing a micro-structure is applied.

2. Description of the Related Art

Conventionally, the photolithography, together with the etching process, is exclusively employed to process a fine three-dimensional shape product with a high precision. In this case, a desired pattern is formed on a resist material by selectively irradiating light thereto and subsequently by applying a solution process to the resist material, and then a material to be processed is etched after the resist material thus processed is applied thereto, so that the etching is selectively carried out for only the surface onto which no resist material is covered. That is, the two areas, a part to be processed and another part not to be processed, are formed a series of processes, i.e., the application of the resist material, exposure, fixation, development, etching of the material to be processed and removing the resist material. In the case of processing a three-dimensional shape product, furthermore, a resist material is newly applied to the material to be processed, and then the above process is repeated after precisely adjusting the position of the material to be processed.

The etching method in the conventional photolithography requires a number of complicated processes, such as resist application, exposure, development, baking and so on. In the exposure process, the intensity (and time) of the exposure light has to be controlled in a precise and uniform manner in order to avoid a change in the resist pattern due to the variation of the exposure intensity.

In the case of a three-dimensional process where the depth is altered in accordance with the position, the shape has to be controlled using a number of expensive masks.

Moreover, in the case of controlling the depth for each position, an adjustment of precisely positioning the formed substrate is always required. Furthermore, the exposure condition is altered for a partially processed material to be processed, compared with that for a flat substrate.

Moreover, it is very difficult to uniformly apply a resist to a substrate due to the surface roughness, when it is partially processed in a three dimension.

As another example for a method of processing a three-dimensional shape in a fine element, a method using the laser process is known. In the process of metals using the conventional laser process method, a high power laser on the basis of the fundamental wave of $CO_2$ or Nd: YAG laser is employed.

In recent years, the second or third harmonic of the YAG (Yttrium Aluminum Garnet), YLF (Yttrium lithium Fluoride) or $YVO_4$ (Yttrium Orthovanadate) is employed in order to realize a fine structure and a precise process.

As a laser light source used for fine process, an UV pulse laser, typically the excimer laser, is employed.

Such a laser normally has a wavelength of 157 nm to 309 nm and a pulse width of several ns to several tens ns. In particular, a polymer absorbent of light having such a wavelength may be processed to remove portions irradiated by such a laser using a pulse having a smaller width, compared with the thermal diffusion length. Therefore, this method is known as a process method providing a high precision without thermal damage.

In recent years, it is known that the femto-second laser is employed for a method of precisely processing a metal or the like. ID this case, a laser having a pulse width of several tens femto-seconds to several hundred femto-seconds is used and Ti: sapphire is typically employed for its light source. It is known that this method is capable of providing a fine and precise process for various materials made of metal, ceramic or others. For instance, see the following papers by the present inventors, Kumagawa and Midorikawa: Appl. Phys. A 63, 109–115 (1996); Oyo-buturi (Jpn. J. Appl. Phys.) 67(9), 1051 (1998); and O Plus E 21 (9), 1130 (1999).

However, there are difficulties and drawbacks in the above-mentioned conventional laser process methods. For instance, the process using the $CO_2$ or YAG laser is fundamentally based on the thermal process, so that it is difficult to process a polymer, low melting material or the like in a high precision, because the material to be processed in the vicinity of the area irradiated by the laser light is thermally deformed and/or melted. In the case of processing metals, thermally disturbed layers in the vicinity of the process area appear due to a high thermal conductivity, so that the deterioration of shape or profile in the area often occurs due to the melting, re-solidification and the like. In these cases, such thermal deterioration provides a reduction in the surface precision for the bottom surface of the processed material to be processed and melt marks on the surface.

Moreover, the application of the process using the excimer laser or the harmonic of the YAG laser is generally restricted to the materials having high absorption efficiency for such a laser wavelength due to the difficulty in the process. Actually, such a material pertains to a restricted type of polymers. In this laser process, it is also difficult to form the bottom surface of the material to be processed in a uniform height and flatness, and it is usually necessary to precisely control the beam shape of the laser light using an expensive optical system. In this case, it is necessary to process the material to be processed by projecting in the reduced mode the laser b am whose intensity is uniformed at the mask position by means of an optical element. Nevertheless, it is difficult to provide a three-dimensional process of the material to be processed having a uniform bottom surface due to the interference with the beams diffracted or split from the mask. It is particularly difficult to form a flat bottom surface in the precision of the order of several tens nm, which precision is required for producing optical elements.

It is known that a high precision can also be obtained even for a material to be processed of metal material with the aid of the abrasion process using the Ti: sapphire laser having a pulse width in a range of sub pico-seconds to pico-seconds. In this case, an expensive optics for forming a flat bottom surface must be provided, as similarly said abrasion is applied. In these lasers, the beam transverse mode is normally a single mode, and the beams diffracted in the mask are apt to interfere with each other. Moreover, there arise problems that the flatness of the processed surface is reduced due to speckle pattern and a fine period generates due to the polarization of the laser light, thereby making it difficult to produce flat surfaces in the material to be processed.

As for the process of a thin layer using a conventional laser, a metal removing method for correcting a photo-mask is known. In the metal removing method, a thin metal layer deposited onto a glass substrate is irradiated by a laser light to selectively remove parts of the layer by melt and evaporation.

In order to produce a three-dimensional structure, a method for laminating the layers of laser absorbing material is proposed in Japanese Patent Laid-Open Publication No. 10-223504. The other methods using a transparent material are proposed in Japanese Patent Laid-Open Publications No. 10-137953 and No. 10-319221. The former provides a method for removing a transparent thin layer of an electroluminescence, in which case, an upper transparent layer is removed using the removing energy duo to the laser abrasion. The latter relates to a method for producing a reflection type optical element, in which case, an anti-reflection film is removed by using the abrasion resulting from laser light passed through it.

Although the upper thin layer of the material to be processed can also be removed by the thin layer processing method using the conventional laser abrasion, no marked improvement in the surface roughness on the bottom surface of the material to be processed can be obtained, compared with that of the above-mentioned laser abrasion. In the case of only absorbent material being employed, a deep depth process can hardly be carried out by a one-shot laser radiation. In case of carrying out a deeper depth process, there is a problem that the quality of the finished material to be processed may be reduced due to the thermal effect. In the method of removing the upper layer using the absorbent layer of the bottom surface, the process of the absorbent layer also advances, so that it is difficult to control the depth in a three-dimensional manner or it is necessary to control the depth by several times irradiating the laser light. In any case, it is difficult to control the process of the three-dimensional shape available in an optical device in the precision of order of nano-meter.

SUMMARY OF THE INVENTION

Accordingly, it is an object of the present invention to a method and an apparatus for processing a three-dimensional structure, a method for producing a three-dimensional shape product and a three-dimensional structure, wherein the three-dimensional structure is available particularly for an optical device and has a smooth and flat surface, after solving the above-mentioned problems in the conventional laser process.

To attain the above object, in a first aspect of the present invention, a method for processing a three-dimensional structure is provided, wherein said method comprising the following steps of: depositing a thin layer for absorption of laser light on a flat substrate; depositing a transparent layer on the thin layer for absorption of laser light; and irradiating a process laser light, passing through the transparent layer; whereby the pulse injection energy of the process laser light is set to be the same as or smaller than the maximum pulse injection energy where the process laser light passes through the transparent layer and is absorbed in the thin layer for absorption of laser light to expose a flat surface as an interface in the thin layer for absorption of laser light, and to be set the same as or greater than the minimum pulse injection energy where the process laser light removes the transparent layer.

In a second aspect of the present invention regarding the method for processing a three-dimensional structure according to the first aspect, the thin layer for absorption of laser light has a greater thermal diffusion rate than the flat substrate.

In a third aspect of the present invention regarding the method for processing a three-dimensional structure according to the first or second aspect, a portion of the transparent layer, the process laser light passing through the portion, and a portion of the thin layer for absorption of laser light, the process laser light penetrating into the portion, are both removed by one-shot pulse radiation of the process laser light.

In a fourth aspect of the present invention regarding the method for processing a three-dimensional structure according to the first or third aspect, a thermal insulation layer having a smaller thermal diffusion rate than the flat substrate is deposited on the flat substrate, and then the thin layer for absorption of laser light is deposited onto the thermal insulation layer.

In a fifth aspect of the present invention regarding the method for processing a three-dimensional structure according to the third aspect, the thin layer for absorption of laser light and the transparent layer are further alternately laminated as a plurality of pairs, and a one-shot laser pulse of the process laser light removes a pair of the thin layer for absorption of laser light and the transparent layer, whereby a removed material section having different depths is formed by removing pairs of the layers in accordance with the number of the one-shot laser pulses.

In a sixth aspect of the present invention regarding the method for processing a three-dimensional structure according to one of the first to fifth aspects, the process laser light is a fundamental or a harmonic of light emitted from an excimer laser or a solid laser and has a pulse width of less than 100 ns.

In a seventh aspect of the present invention regarding the method for processing a three-dimensional structure according to the third aspect, the thickness of the transparent layers is different from each other.

In an eighth aspect of the present invention regarding the method for processing a three-dimensional structure according to the first or second aspect, the radiation of the process laser light is carried out by transferring a mask pattern thereto.

In a ninth aspect of the present invention regarding the method for processing a three-dimensional structure according to one of the first to eighth aspects, the process is carried out by shifting the position of a laminate comprising the flat substrate, the thin layer for absorption of laser light and the transparent layer relative to the radiation position of the process laser light.

In a tenth aspect of the present invention regarding the method for processing a three-dimensional structure according to the third aspect, the process laser light is focused in the form of a round shape to impinge on the thin layer for absorption of laser light.

In an eleventh aspect of the present invention regarding the method for processing a three-dimensional structure according to the third aspect, the process laser light is focused in the form of a straight line to impinge on the thin layer for absorption of laser light.

In a twelfth aspect of the present invention, the method for producing a three-dimensional shape product is provided, wherein a duplicate is formed from a three-dimensional structure produced by the method for processing a three-dimensional structure according to one of the first to eleventh aspects, and then a three-dimensional shape product having the same shape as the duplicate or an inversed shape with respect to the duplicate is formed.

In a thirteenth aspect of the present invention regarding the method for producing a three-dimensional shape product, the duplicate according to the twelfth aspect is used as a stamper for a light-recording medium.

In a fourteenth aspect of the present invention regarding the method for producing a three-dimensional shape product, the duplicate according to the twelfth aspect is used as a metal mold for a diffraction optical element.

In a fifteenth aspect of the present invention, an apparatus for processing a three-dimensional structure is provided, the apparatus comprising: process laser light generating means for introducing a process laser light into a thin layer for absorption of laser light, passing through a transparent layer, where a laminate is formed by depositing the thin layer for absorption of laser light on a flat substrate and then by depositing the transparent layer on the thin layer for absorption of laser light; and process laser light adjusting means for adjusting the pulse injection energy of the process laser light, which is introduced from the process laser light generating means via the transparent layer into the thin layer for absorption of laser light, in which case the pulse injection energy of the process laser light is set to be the same or smaller than the maximum pulse injection energy where the process laser light passes through the transparent layer and is absorbed in the thin layer for absorption of laser light to expose a flat surface as an interface, and to be set the same or greater than the minimum pulse injection energy where the process laser light removes the transparent layer.

In a sixteenth aspect of the present invention, an apparatus for processing a three-dimensional structure is provided, the apparatus comprising: process laser light generating means for introducing a process laser light into a thin layer for absorption of laser light, passing through a transparent layer, where a laminate is formed by depositing the thin layer for absorption of laser light on a flat substrate and then by depositing the transparent layer on the thin layer for absorption of laser light; mask means interposed between the process laser light generating means and the transparent layer; transfer means for transferring a pattern in the mask means onto a material to be processed; and process laser light adjusting means for adjusting the pulse injection energy of the process laser light, which is introduced from the process laser light generating means via the transparent layer into the thin layer for absorption of laser light, in which case the pulse injection energy of the process laser light is set to be the same or smaller than the maximum pulse injection energy where the process laser light passes through the transparent layer and is absorbed in the thin layer for absorption of laser light to expose a flat surface as an interface, and to be set the same or greater than the minimum pulse injection energy where the process laser light removes the transparent layer.

In a seventeenth aspect of the present invention regarding the apparatus for processing a three-dimensional structure according to the sixteenth aspect, said apparatus further comprising: adjusting means for process position for adjusting the position of the laminate relative to the process position of the process laser light; and laser light control means for controlling the laser light in synchronization with the position of the laminate.

In an eighteenth aspect of the present invention regarding the apparatus for processing a three-dimensional structure according to the sixteenth aspect, the mask means allows the transmission pattern of the process laser light to be varied, and the process laser light can be irradiated several times onto the same portion after changing the transmission pattern.

In a nineteenth aspect of the present invention regarding the apparatus for processing a three-dimensional structure according to one of the sixteenth to eighteenth aspects, the process laser light is a fundamental or a harmonic of light emitted from an excimer laser or a solid laser and has a pulse width of less than 100 ns.

In a twentieth aspect of the present invention regarding the apparatus for processing a three-dimensional structure according to the fifteenth or sixteenth aspect, a plurality of pairs of the thin layer for absorption of laser light and the transparent layer is laminated, and a one-shot laser pulse removes a pair of the thin layer for absorption of laser light and the transparent layer, whereby a removed material section having different depths is formed by removing pairs of the layers in accordance with the number of the one-shot laser pulses.

In a twenty-first aspect of the present invention, a three-dimensional structure including a laminated material to be processed is provided, said three-dimensional structure comprising a flat substrate; a transparent layer capable of transmitting a process laser light towards the flat substrate; and a thin layer for absorption of laser light interposed between the flat substrate and the transparent layer to absorb the energy of the process laser light, said three-dimensional structure comprising: a removed material section formed by removing both part of the transparent layer and part of the thin layer for absorption of laser light, when the process laser light incident from the side of the transparent layer is absorbed in the thin layer for absorption of laser light; and a bottom surface of the removed material section where the thin layer for absorption of laser light remains un-removed at an interface and exposed in the laser light incident direction.

In a twenty-second aspect of the present invention regarding the three-dimensional structure according to the twenty-first aspect, the thin layer for absorption of laser light has a larger thermal diffusion rate at a depth of the laser light being incident just thereon than at a larger depth.

In a twenty-third aspect of the present invention regarding the three-dimensional structure according to twenty-first aspect, the thin layer for absorption of laser light is made of a material having a larger thermal diffusion rate than that of the flat substrate.

In a twenty-fourth aspect of the present invention regarding the three-dimensional structure according to the twenty-first aspect, a thermal insulation layer is interposed between the thin layer for absorption of laser light and the flat substrate, and has a smaller thermal diffusion rate than that of the flat substrate.

In a twenty-fifth aspect of the present invention regarding the three-dimensional structure according to one of the twenty-first to twenty-third aspects, the thin layer for absorption of laser light and the transparent layer are further alternately laminated, and the removed material section has different depths.

In a twenty-sixth aspect of the present invention regarding the three-dimensional structure according to the twenty-fifth aspect, the thickness of the transparent layers is different from each other.

In a twenty-seventh aspect of the present invention regarding the three-dimensional structure according to one of the twenty-first to twenty-sixth aspects, the thin layer for absorption of laser light is a metal layer.

In a twenty-eighth aspect of the present invention regarding the three-dimensional structure according to one of the twenty-first to twenty-seventh aspects, the transparent layer is a thin layer made of polymer.

In a twenty-ninth aspect of the present invention regarding the three-dimensional structure according to one of the twenty-first to twenty-seventh aspects, the transparent layer is made of ceramic material having a smaller thermal diffusion rate than the thin layer for absorption of laser light.

In a thirtieth aspect of the present invention regarding a three-dimensional structure according to one of the twenty-first to twenty-ninth aspects, the laminate is processed by transferring a mask pattern thereto.

In a thirty-first aspect of the present invention regarding a three-dimensional structure, a reflection surface is formed on a surface of the three-dimensional structure according to one of the twenty-first to thirtieth aspects.

BRIEF DESCRIPTION OF THE DRAWINGS

FIG. 4 is a sectional view of a fourth embodiment in a method for producing a three-dimensional structure according to the invention;

FIG. 11 is a drawing showing the ninth embodiment in a method for producing a three-dimensional structure according to the invention;

FIG. 12 is a drawing showing a tenth embodiment in a method for producing a three-dimensional structure according to the invention;

DETAILED DESCRIPTION OF THE PREFERRED EMBODIMENTS

First Embodiment

Figure 1:
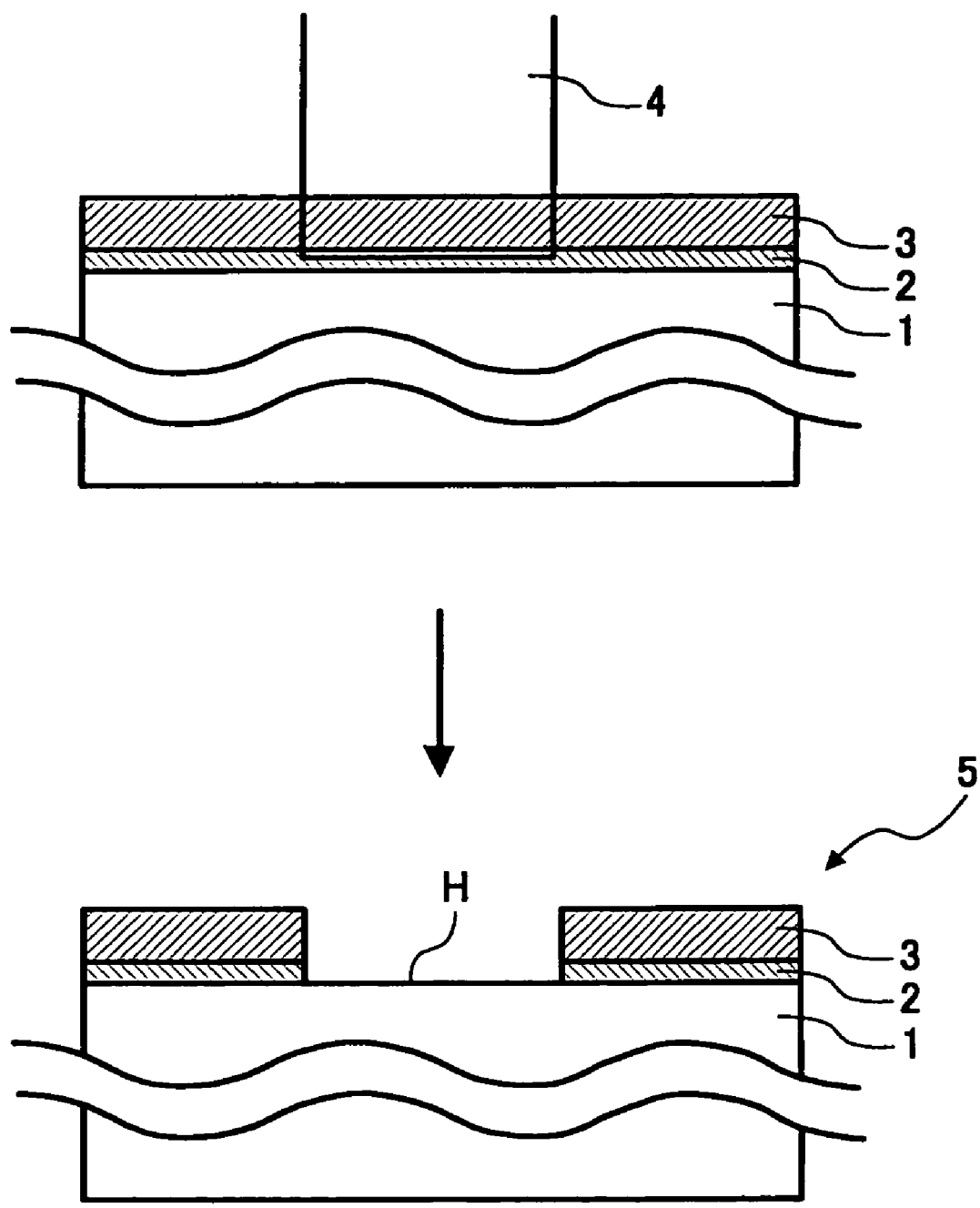
FIG. 1 is a sectional view of a first embodiment in a method for producing a three-dimensional structure according to the invention.

FIG. 1 is a sectional view of a first embodiment in a method for producing a three-dimensional structure according to the invention.

As shown in FIG. 1, the three-dimensional structure 5 comprises a flat substrate 1 having a flat and smooth surface of glass, Si, SUS or the like; a thin layer for absorption of laser light 2 deposited onto the flat substrate 1; and a transparent layer 3 capable of transmitting a process laser light 4 towards the thin layer for absorption of laser light 2. In the case of a SUS substrate being used for the flat substrate 1, Al, Cu, Ni or the like may be used as a material for the thin layer for absorption of laser light.

The three-dimensional structure 5 is provided with a removed material section having a very small size where part of the transparent layer 3 and part of the thin layer for absorption of laser light 2 are removed by the absorption of the process laser light 4 incident from the transparent layer 3 in the thin layer for absorption of laser light 2; and an interface laminated on the thin layer for absorption of laser light 2 on the downstream side in the laser light incident direction, i.e., the bottom surface of the removed material section which corresponds to the flat surface H remaining un-removed in the surface of the flat substrate 1.

As shown in FIG. 1, the thin layer for absorption of laser light 2 made of a material having a high absorbing efficiency for the process laser light 4 and a high thermal conductivity is d posited onto the flat substrate 1 in the first embodiment of the laser processing method, and then a transparent layer 3 having a high transparency for the process laser light 4 is deposited onto the thin layer for absorption of laser light 2. It is preferable that the flat substrate 1 and the transparent layer 3 is constituted by a material having a thermal conductivity smaller than that in the thin layer for absorption of laser light 2.

Thereafter, the layer structure thus laminated is exposed by the process laser light 4 from the side of the transparent layer 3. In this case, the thickness of each of the layers 2 and 3 and the intensity of the laser light are adjusted in such a way that the process laser light 4 passes through the transparent layer 3 and almost all of its energy is absorbed in the surface of the thin layer for absorption of laser light 2.

The energy absorbed diffuses inside the thin layer for absorption of laser light 2, and this provides an abrupt increase in the temperature of the thin layer for absorption of laser light 2. As a result, the thin layer for absorption of laser light 2 is removed from the flat substrate 1 at the interface at which the thin layer for absorption of laser light 2 is in contact therewith in a weak coupling force, and the transparent layer 3 is also removed either simultaneously or contentiously together with the thin layer for absorption of laser light 2. The removal of the thin layer for absorption of laser light 2 and the transparent layer 3 at an area at which the process laser light 4 is illuminated causes the flat surface H to be exposed from the surface of the flat substrate 1, thereby enabling a three-dimensional structure 5 having a bottom surface corresponding to the removed area to be formed.

In the conventional laser heating process, a rise in the temperature occurs in isotropic directions from the irradiated area due to the thermal diffusion of the heat resulting from the laser light in the material, so that the removal takes place from the area at which the temperature of the material arrives at the melting temperature or the evaporation temperature, and a thermally deteriorated layer whose profile corresponds to the laser beam intensity from the irradiated area to the bottom surface is produced to form a process trace.

In accordance with the first aspect of the invention, the production of the thin layer for absorption of laser light 2 in the form of a very thin layer permits providing an energy selectivity for the process laser light 4 to the thin layer for absorption of laser light 2. When the laser light absorption layer is relatively thick, thermal diffusion causes the thermal deterioration and a melt trace to remain either in the vicinity of the irradiated area or on the bottom surface of the process section. However, the thermally deteriorated area can be greatly reduced by decreasing the thickness of the laser light absorption layer.

In the process of a substrate including only an absorbing layer, the above-mentioned isotropic thermal diffusion causes to reduce the amount of removal by one shot laser pulse in order to attain a high precision in the process. In the present invention, however, a transparent layer 3 on the thin layer for absorption of laser light 2 makes it possible to increase the amount of removal by one shot laser pulse.

Moreover, the provision of the transparent layer 3 permits varying the amount of removal by one shot laser pulse by changing the thickness of the transparent layer 3.

Since, in this case, the removal takes place at the interface between the flat substrate 1 and the thin layer for absorption of laser light 2, the smoothness of the flat surface H, which corresponds to the bottom surface of the removed material section, depends on the smoothness of the flat substrate 1. As a result, a flat substrate 1 having a very smooth surface makes it possible to obtain a three-dimensional structure 5 having a flat bottom surface processed in a highly precision.

In the conventional laser abrasion process of a polymer, the polymer having a low thermal diffusion rate is used for the light absorption layer. In this case, however, the laser-processed portion provides a profile depending on the distribution of the intensity of the incident laser beam. When, for instance, a beam having a Gaussian intensity distribution irradiates the process area, the area exhibits a profile similar to the Gaussian distribution of the intensity of beam, thereby making it difficult to obtain a flat process area.

In the present invention, however, as shown in FIG. 1, the heat diffuses from the irradiated area into the layer in a high rate and the removal can selectively be carried out at the interface between the flat substrate 1 and the thin layer for absorption of laser light 2 as a thermal diffusion layer, thereby enabling a smooth surface to be obtained independently of the laser intensity distribution.

In accordance with the present invention, areas to be processed can simultaneously be removed by the one shot laser pulse and therefore ensures the removal at a much higher rate, compared with that in the conventional laser abrasion method.

Since, moreover, the depth of process is determined by the initial layer thickness, a high precision can be realized for controlling the depth of process.

EXAMPLE 1

Referring to FIG. 1, example 1 of the laser processing method in the invention will be described.

As shown in FIG. 1, a thin layer for absorption of laser light 2 made of Ni or the like is deposited onto a flat substrate 1 made of glass, Si or the like, in this example, a glass substrate having a flat upper surface. A transparent layer 3 made of a light transmitting material, such as acrylic resin, ITO (Indium Tin Oxide) or the like is deposited onto the upper surface of the layer 2. A process laser light 4 having certain intensity is spatial-selectively irradiated onto the material to be processed thus laminated from the upper side of the transparent layer 3.

The certain intensity of the process laser light 4 implies the intensity where almost all of the energy of the laser light is absorbed in the thin layer for absorption of laser light 2. That is, an injection pulse energy E0 of the process laser light 4 absorbed in the thin layer for absorption of laser light 2 via the transparent layer 3 is set to be the same or smaller than the maximum injection pulse energy E1 where the flat surface H corresponding to the interface on the downstream side in the incident direction of the laser light can be exposed without any damage of the flat surface H and to be the same or greater than the minimum injection pulse energy E2 where the transparent layer 3 can be removed on the upstream side in the incident direction of the laser light, thereby enabling the process laser light 4 to be absorbed in the thin layer for absorption of laser light 2 via the transparent layer 3. In other words, the injection pulse energy E0, the maximum injection pulse energy E1 and the minimum injection pulse energy E2 have to satisfy the relation; $E2 \leq E0 \leq E1$.

The radiation of the process laser light 4 having such intensity causes the energy of the process laser light 4 to be transmitted inside the thin layer for absorption of laser light 2 due to the thermal diffusion in the thin layer for absorption of laser light 2, thereby causing the temperature of the thin layer for absorption of laser light 2 to be increased. Then, the exfoliation takes place at the interface between the thin layer for absorption of laser light 2 and the flat substrate 1, so that the thin layer for absorption of laser light 2 evaporates and peels off together with the removal of the transparent layer 3.

As a result, the thin layer for absorption of laser light 2 and the transparent layer 3 are removed only at the laser-irradiated area, so that the flat surface of the flat substrate 1 is exposed and the flat surface H having a high smoothness can be obtained at the bottom surface of the removed area. Thus, a three-dimensional structure 5 can be obtained and thereby a three-dimensional profile process can be realized.

Second Embodiment

Figure 2:
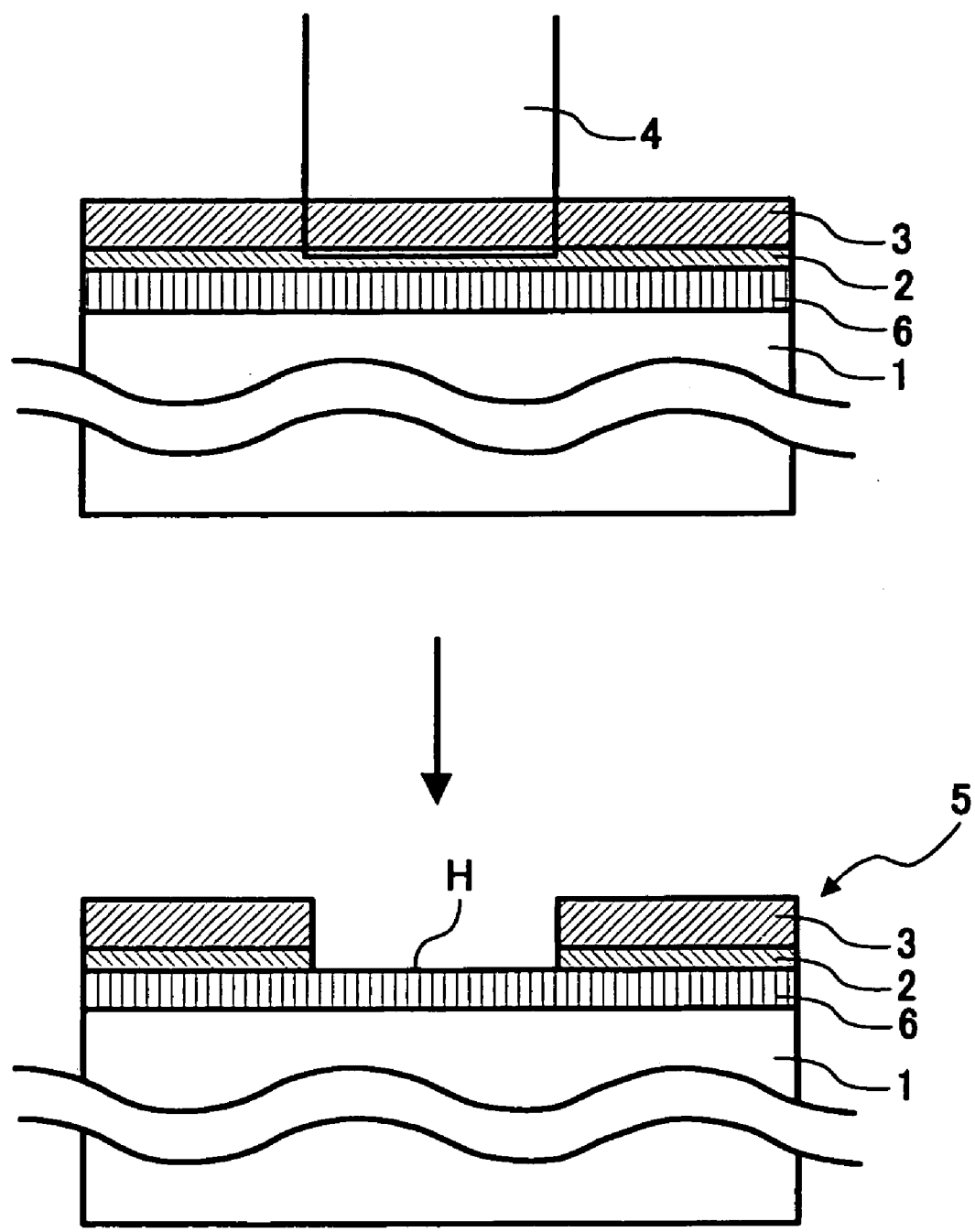
FIG. 2 is a sectional view of a second embodiment in a method for producing a three-dimensional structure according to the invention.

FIG. 2 is a sectional view of a second embodiment in a method for producing a three-dimensional structure according to the invention.

As shown in FIG. 2, a three-dimensional structure 5 comprises a flat substrate 1 made of glass, Si, SUS or the like and having a flat surface; a thermal isolation layer 6 deposited on the flat substrate 1; a thin layer for absorption of laser light 2 deposited on the thermal isolation layer 6; and a transparent layer 3 for transmitting a process laser light 4 towards the thin layer for absorption of laser light 2.

Moreover, the three-dimensional structure 6 in the second embodiment is equipped with a finely removed material section formed by removing part of the transparent layer 3 and part of the thin layer for absorption of laser light 2 due to the absorption of the process laser light 4 incident from the side of the transparent layer 3 in the thin layer for absorption of laser light 2; and an interface on the downstream side of the thin layer for absorption of laser light 2 in the incident direction of the thin layer for absorption of laser light 2, i.e., a bottom surface of the removed material section exposed without removal of a flat surface H corresponding to the surface of the thermal isolation layer 6 in the case of the second embodiment.

As shown in FIG. 2, the thermal isolation layer 6 as a first material layer is deposited onto the flat substrate 1 so as to form a smooth surface in a laser process method according to the second embodiment. The deposition can be realized by applying, spin coating, dipping or evaporating the thermal insulation material. The thin layer for absorption of laser light 2, which has high absorption efficiency for the process laser light 4 and high thermal conductivity, is deposited onto the upper surface of the thermal isolation layer. Moreover, the transparent layer 3 having a high transparency for the process laser light 4 is deposited on the upper surface of the thin layer for absorption of laser light 2 with the same method as in the thermal isolation layer 6. In this case, it is preferable that the thermal conductivity of each of the thermal isolation layer 6 and transparent layer 3 is smaller than that of the thin layer for absorption of laser light 2.

Thereafter, the process laser light 4 is irradiated to the laminate from the side of the transparent layer 3. The thickness of each of layers 2 and 3 and the intensity of the laser light are adjusted such that the process laser light 4 passes through the transparent layer 3 and most of its energy is absorbed in the surface of the thin layer for absorption or laser light 2.

The energy absorbed in the thin layer for absorption of laser light 2 propagates in the thin layer for absorption of laser light 2 and thus the temperature of the thin layer for absorption of laser light 2 abruptly rises, so that the material of the thin layer for absorption of laser light 2 is removed from the interface between the thin layer for absorption of laser light 2 and the flat substrate 1 weakly coupled to each other, thereby enabling the transparent layer 3 to be removed together with the thin layer for absorption of laser light 2.

In the second embodiment, adding to the effect obtainable from the method in the first embodiment, the application of the thermal isolation layer 6 permits expanding the selectable range of materials for the flat substrate 1 and thereby materials providing a relatively less smoothness are available.

Moreover, the employment of heat-resisting material such as ceramic material for the thermal isolation layer 6 permits increasing the intensity of the process laser light 4, while maintaining a high precision for processing the bottom surface at the irradiated area, so that the amount of removal by one shot pulse radiation of the process laser light 4 can be increased.

Moreover, the employment of polymer, such as polyimide, having a small thermal conductivity for the thermal isolation layer 6 permits inducing an increase in the temperature of the thin layer for absorption of laser light 2, thereby enabling a high speed process to be realized with a low energy.

EXAMPLE 2

Referring to FIG. 2, the laser process method in the second embodiment of the invention will be described.

As shown in FIG. 2, a thermal isolation layer 6 made of a material having a smaller thermal diffusion rate than that of the flat substrate 1, for example, polyimide, is applied in the form of a layer onto a flat substrate 1 made of glass, Si or the like and having a flat upper surface, the flat substrate 1 being made of glass in this example, and then a thin layer for absorption of laser light 2 made of Al, Cu, Ni or the like is deposited onto the flat upper surface of the thermal isolation layer 6. In this example, a thin Ni film is employed as the thin layer for absorption of laser light 2. Furthermore, a transparent layer 3 made of a light-transmitting material, such as acrylic resin, ITO or the like is deposited on the upper surface of the thin layer for absorption of laser light 2.

A process laser light 4 such as a femto-second titanium sapphire laser light (femto-second Ti: Sapphire laser light) having a preset intensity is spatial-selectively irradiated to the laminate from the upper side of the transparent layer 3. Most energy of the process laser light 4 is absorbed in the thin layer for absorption of laser light 2 and propagates inside the thin layer for absorption of laser light 2 after the radiation or during the radiation, so that the temperature of the thin layer for absorption of laser light 2 rises. In this case, the thermal diffusion is limited by the thermal isolation layer 6. As a result, the thin layer for absorption of laser light 2 is removed from the thermal isolation layer 6, and the transparent layer 3 is removed together with the evaporation and exfoliation of the thin layer for absorption of laser light 2.

As a result, the thin layer for absorption of laser light 2 and the transparent layer 3 are removed only at the laser-irradiated area, so that the flat surface of the thermal isolation layer 6 is exposed and the flat surface H having a high smoothness can be obtained at the bottom surface of the removed area. Thus, a three-dimensional structure 5 can be obtained and thereby a three-dimensional profile process can be realized.

Third Embodiment

Figure 3:
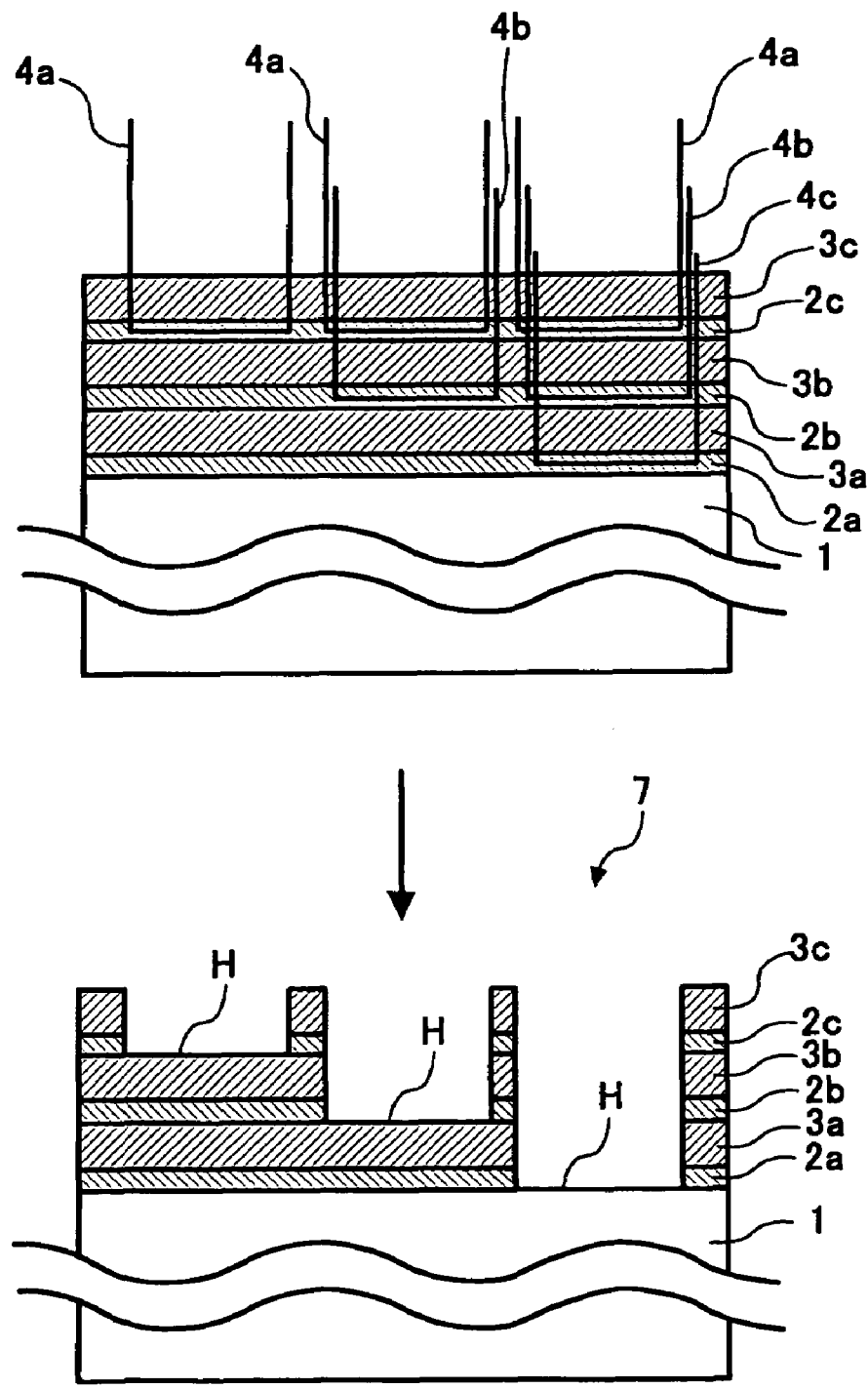
FIG. 3 is a sectional view of a third embodiment in a method for producing a three-dimensional structure according to the invention.

As shown in FIG. 3, a three-dimensional structure 7 comprises a flat substrate 1 made of glass, Si, SUS or the like having a flat surface; a first thin layer for absorption of laser light 2a deposited onto the flat substrate 1; a first transparent layer 3a deposited onto the first thin layer for absorption of laser light 2a to transmit a process laser light 4 towards the first thin layer for absorption of laser light 2a; a second thin layer for absorption of laser light 2b deposited onto the first transparent layer 3a; a second transparent layer 3b deposited onto the second thin layer for absorption of laser light 2b to transmit the process laser light 4 towards the second thin layer for absorption of laser light 2b; a third thin layer for absorption of laser light 2c deposited onto the second transparent layer 3b; and a third transparent layer 3c deposited onto the third thin layer for absorption of laser light 2c to transmit the transparent layer 4.

Moreover, the three-dimensional structure 7 is equipped with a finely removed material section (removal area on the left side in FIG. 3) which is formed by removing part of the third thin layer for absorption of laser light 2c and part of the third transparent layer 3c due to the absorption of a first time process laser light 4a incident from the side of the third transparent layer 3c in the third thin layer for absorption of laser light 2c; and an interface for the third thin layer for absorption of laser light 2c on the front side in the laser light incident direction, i.e., a bottom surface (bottom surface on the left side in FIG. 3) of the removed material section remaining un-removed on a flat surface H corresponding to the surface of the second transparent layer 3b in this embodiment.

Moreover, the three-dimensional structure 7 is equipped with a finely removed material section (removal area at the center in FIG. 3) which is formed by removing part of the second thin layer for absorption of laser light 2b and part of the second transparent layer 3b due to the absorption of a second time process laser light 4b incident from the side of the second transparent layer 3b in the second thin layer for absorption of laser light 2b; and an interface for the second thin layer for absorption of laser light 2b on the front side in the laser light incident direction, i.e., a bottom surface (bottom surface at the center in FIG. 3) of the removed material section remaining un-removed on a flat surface H corresponding to the surface of the first transparent layer 3a in this embodiment.

Moreover, the three-dimensional structure 7 is equipped with a finely removed material section (removal area on the right side in FIG. 8) which is formed by removing part of the first thin layer for absorption of laser light 2a and part of the first transparent layer 3a due to the absorption of a third time process laser light 4c incident from the side of the first transparent layer 3a in the first thin layer for absorption of laser light 2a; and an interface for the first thin layer for absorption of laser light 2a on the front side in the laser light incident direction, i.e., a bottom surface (bottom surface on the right side in FIG. 3) of the removed material section remaining un-removed on a flat surface H corresponding to the surface of the flat substrate 1 in this embodiment.

As shown in FIG. 3, in the laser process method of the third embodiment, the first thin layer for absorption of laser light 2a having a high absorption rate for the process laser light and a high thermal conductivity is deposited in the form of a thin film on the flat substrate 1. Thereafter, the first transparent layer 3a having a high transparency for the process laser light is deposited onto the first thin layer for absorption of laser light 2a. Furthermore, the second thin layer for absorption of laser light 2b and the second transparent layer 3b are alternately laminated at least two times on the upper surface of the first transparent layer 3a. In this case, it is preferable that the materials of the flat substrate 1 and the transparent layers 3a–3c have a smaller thermal conductivity than that of the thin layer for absorption of laser light 2.

Thereafter, the process laser light 4a is irradiated to the laminate from the side of the third transparent layer 3c, at three different positions in this embodiment. The thickness of the two uppermost layers and the intensity of the process laser light are adjusted such that the process laser light 4a passes through the third transparent layer 3c and most of its energy is absorbed in the surface of the third thin layer for absorption of laser light 2c.

The absorbed energy of the process laser light 4a is propagated in the third thin layer for absorption of laser light 2c, and therefore the temperature of the third thin layer for absorption of laser light 2c abruptly rises. This causes inducing the removal of material from the interface between the third thin layer for absorption of laser light 2c and the second transparent layer 3b weakly coupled with each other, thereby enabling the second transparent layer 3b to be removed simultaneously or sequentially together with the third thin layer for absorption of laser light 2c.

In this embodiment, one-shot pulse of the process laser light 4b is again irradiated to the same center and right hand areas to remove the second thin layer for absorption of laser light 2b and the second transparent layer 3b. Such a selective radiation of the process laser light ensures a digital control of the depth for processing areas, thereby enabling a fine three-dimensional structure having a flat and smooth bottom surface H to be produced.

In the above description, the process laser light is irradiated sequentially at three portions, two portions and a portion to form the three-dimensional structure 7. However, the three-dimensional structure 7 can also be produced by sequentially irradiating a portion where the material should be removed at the greatest depth; two portions, i.e., the above-mentioned portion and a second portion where the material should be removed at a next greater depth; and three portions, i.e., the first portion, second portion and a third portion where the material should be removed at a next greater depth. The order of the irradiated portions can be altered arbitrarily. The above description is provided for three removed areas. However, the selective radiation can also be carried out for more than three portions.

As described above, the third embodiment indicates that the number of the laser radiation can digitally control the depth of processing.

This also indicated that the re-adjustment or alignment of positions carried out after removing the substrate in the process of photolithography is no longer required, and a desired three-dimensional shape can be spatial-selectively produced only by means for either controlling the position of the laser process or moving the substrate.

The process method of the third embodiment makes it possible to manufacture, for instance, a multi-binary diffraction optical element, a hologram optical element based on the computer-controlled position of process, or the like.

EXAMPLE 3

As shown in FIG. 3, a thin layer for absorption of laser light 2a made of Ni is deposited on a flat substrate 1 made of glass at a thickness of, for instance, 50 nm by sputtering, and then a transparent layer 3a of ITO is deposited on the upper surface of the thin layer for absorption of laser light at a thickness of, for instance, 100 nm by sputtering. Moreover, Ni is similarly deposited to the upper surface of the transparent layer 3a by sputtering to form a thin layer for absorption of laser light 2b and further ITO is deposited at the same thickness to form a transparent layer 3b. By repeating the processed, a laminate of a multi-layer structure can be produced.

A process laser light, such as a femto second Ti: sapphire laser light or the like having an intensity, is spatial-selectively irradiated to the laminate from the upper side of the transparent layer 3c. The energy of the process laser light 4a is mostly absorbed in the thin layer for absorption of laser light 2c and after or during the laser radiation the energy is propagated in the thin layer for absorption of laser light 2c, thereby causing the temperature of the thin layer for absorption of laser light 2c to be increased. Hence, the uppermost ITO layer and the Ni layer disposed beneath thereof are removed by one-shot laser pulse. Thereafter, the radiation position is shifted and the laser light is irradiated to the middle ITO layer and the Ni layer disposed beneath thereof. In this case, the layer is removed in accordance with the number of pulses, and a three-dimensional shape having a twice-greater depth than in the initial removed area is produced. By further shifting the irradiating position and by changing the number of pulses, a three-dimensional structure 7 having a varied thickness can be obtained.

Fourth Embodiment

FIG. 4 is a sectional view of a fourth embodiment in a method for producing a three-dimensional structure according to the invention.

As shown in FIG. 4, the three-dimensional structure 9 has the same layer arrangement as that of the third embodiment shown in FIG. 3, except for a difference in the thickness of the respective layers. The method for processing the three-dimensional structure in the fourth embodiment is the same as that in the third embodiment.

A substantial difference from the third embodiment is that the thickness can be altered for one of the thin layer for absorption of laser light s and one of the transparent layers, respectively. As for, e.g., a wavelength $\lambda$ of a reference laser light used for an optical element, the thickness is set to be $\lambda/2$ for the first layer and $\lambda/4$ for the second layer. In this case, it is desirable that the thermal conductivity for the flat substrate 1 and the transparent layer 3a, 3b, 8 is smaller than that for the thin layer for absorption of laser light s.

Thereafter, a process laser light 4a is irradiated to the laminate from the side of the transparent layer 8. The thickness of two outer layers and the intensity of the laser light is adjusted such that the process laser light 4a passes through the transparent layer 8 and its energy is mostly absorbed in the surface of the thin layer for absorption of laser light 2c.

The energy absorbed is propagated in the thin layer for absorption of laser light 2c, and therefore the temperature of the thin layer for absorption of laser light 2c abruptly rises, so that the thin layer for absorption of laser light 2c is removed from the interface between the thin layer for absorption of laser light 2c and the transparent layer 3b weekly coupled with each other on the lower surface side of the thin layer for absorption of laser light 2c, thereby enabling the transparent layer 8 to be removed simultaneously or continuously together with the thin layer for absorption of laser light 2c.

Furthermore, one-shot pulse of the laser light is irradiated to the same portion provides a removal of the transparent layer 3b and the thin layer for absorption of laser light 2b adjacent to the lower surface side of the removed thin layer for absorption of laser light 2c.

Such a selective radiation of the process laser light causes the depth of process area to be digitally controlled, so that a fine three-dimensional structure having a smooth bottom surface can be produced.

In the fourth embodiment, the thickness control of the transparent layer in the initial stage can expand the controllable range of the depth in the processed area without any alteration of the radiation intensity of the process laser light.

Hence, pulses of the laser light irradiating a selected area of the element having a varied depth can be digitally controlled. Furthermore, for instance, phase modulation elements, whose property is altered with the change of the depth, can be spatial-selectively formed on a substrate.

EXAMPLE 4

As shown in FIG. 4, a thin layer for absorption of laser light 2a of a thin Ni layer is deposited onto a flat substrate 1 of glass by sputtering and a first transparent layer 3a is further deposited onto the thin layer for absorption of laser light 2a. In this case, the total thickness of the thin layer for absorption of laser light 2a and the transparent layer 3a should be set to be $\lambda/4$ for a wavelength $\lambda$. Then, a thin layer for absorption of laser light 2b and a transparent layer 3b both having the same thickness are similarly deposited, and further a thin layer for absorption of laser light 2c as a third absorbing layer and a transparent layer 8 are deposited. In this case, the total thickness of the thin layer for absorption of laser light 2c as the third absorbing layer and the transparent layer 8 as the third transparent layer should be set to be $\lambda/2$ by altering the thickness of only the transparent layer 8.

By so doing, a multi-layer structure having a thickness different in the respective layers can be produced. Then, a process laser light 4a, such as femto second Ti: sapphire laser light, having a preset intensity is spatial-selectively irradiated to the laminate from the side of the transparent layer 8. The energy of the process laser light 4a is mostly absorbed in the thin layer for absorption of laser light 2c and propagated in the thin layer for absorption of laser light 2c after radiation or during radiation, so that the temperature of the thin layer for absorption of laser light 2c rises. Then, the layers at one portion can be removed by one-shot pulse radiation. Thereafter, a spatial-selective removal of layers is carried out by controlling the laser illumination position and the number of laser illumination pulses. Since the thickness of only the transparent layer 8 is altered, a three-dimensional structure 9 having a varied depth can be produced without substantial alteration of the radiation energy. The three-dimensional structure 9 can spatially alter the phase for a reference wavelength $\lambda$, and therefore is available for a wave front controlling element. This provides an applicability of producing an element in which, for instance, a ½-wavelength plate and a ¼-wavelength plate can be integrated on a single substrate.

Fifth Embodiment

In the laser process method according to one of the first to fourth embodiments, the thin layer for absorption of laser light is a thin metal film made of a metallic material, such as Ni, Al, Au or the like. In this case, the thin metal film is formed from the above metallic material in a thickness of several nm to several hundred nm by means of the evaporation, sputtering, CVD or the like.

The metallic material has a strong absorption in the vicinity of the surface for radiation having a wavelength in a range of ultraviolet or from visible to infrared light. It is known that the light absorbing length (light penetrating length) D can be expressed by the following equation (1).

$$D = \alpha^{-1} = \lambda/4\pi\kappa, \qquad (1)$$

where $\kappa$ is the complex dielectric constant, $\alpha$ is the absorption coefficient and $\lambda$ is the wavelength.

Figure 5:
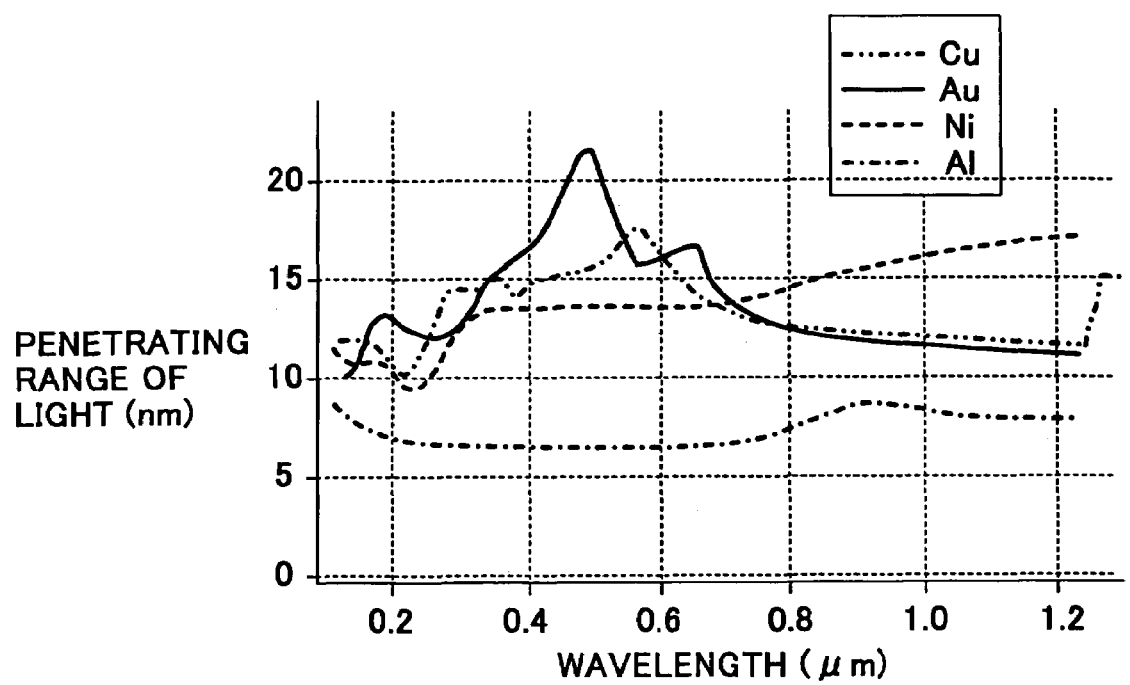
FIG. 5 is a diagram showing the relationship between the light penetrating depth and the wavelength in a fifth or thirteenth embodiment according to the invention.

The light penetrating length for typical metals is shown as a function of the wavelength in FIG. 5. It can be recognized that for these metallic materials the absorption of the light occurs within a very restricted range of several tens nm in a wide range. It is also well known that the heat transmission rate in the metallic material is extremely high and that the heat transmitting distance (thermal diffusion length) L can be expressed as a function of the transition period $\tau$ by the following equation (2):

$$L = \sqrt{(d\tau)} \qquad (2)$$

where d is the thermal diffusion rate.

Since the heat transmission rate is so high and the light is absorbed in the surface, the metal thin films laminated at a thickness of, for instance, several tens nm is thermally excited by the light illumination and tends to become a high temperature at a very high speed. In this case, the thin metal layer is sandwiched between other materials so that the heat is accumulated therebetween. As a result, only the thin metal layer and the flat substrate are removed after thermally separated from the flat surface being in contact with the thin metal layer. The thickness of the material is of order of several tens nm and therefore the heat transmission range can be set to be such a magnitude. Accordingly, a high precision process restricted in the vicinity of the laser illumination area is feasible.

Metal can advantageously be used, since it can easily be deposited or applied to another material in the form of a thin film, and further the cost of production is very small.

Sixth Embodiment

A laser process method of the sixth embodiment is the same as those of the first to fourth embodiments. In this case, a transparent layer is made of a polymer transparent for the process laser light. In the case of the process laser light in a range from the visible to the infrared light, the polymer can be selected from an acrylic resin, a PET resin, a polyimide resin or the like. In the case of the process laser light used in an ultraviolet range, a polymer containing fluorine, an acrylic resin having high transparency, a poly carbonate resin having high transparency or the like can be used.

The transparent layer can be formed by spin coating or dipping a liquid resin under an appropriate control of the layer thickness.

The usage of polymer for transparent material makes it possible to produce the transparent layer having a controlled layer thickness with reduced cost. Such a liquid material provides an easy thickness control and permits hardening with heat or light, so that the layer can be prepared in a wide thickness range.

In addition, a wide selectable range for the material makes it easy to determine with a reduced cost a desired material, which ensures a high transparency for the process laser light and has a reduced thermal deterioration.

Seventh Embodiment

A laser process method of the seventh embodiment is the same as those of the first to fourth embodiments, and a ceramic material is used for the transparent layer. ITO, titanium oxide or the like can be used for the transparent material. In this case, the transparent layer is prepared by sputtering under the thickness control.

The usage of ceramic material for the transparent layer permits providing a highly precise process with reduced thermal damage. A variety of the materials make it possible to easily select a material having a high transparency for the process laser light.

In addition, these materials permit forming a layer in a thickness of order of nm by sputtering or the like, thereby enabling the depth control to be performed in high precision.

Since the melting point of these materials is much greater than that of metals, the energy of the laser beam incident to a metal can be increased in the case of a multi-layer, thereby allowing a greater amount of removal to be attained with one-shot laser pulse.

Moreover, these materials ensure a reduced thermal deterioration as well as the processing with a high quality.

Eighth Embodiment

Figure 6:
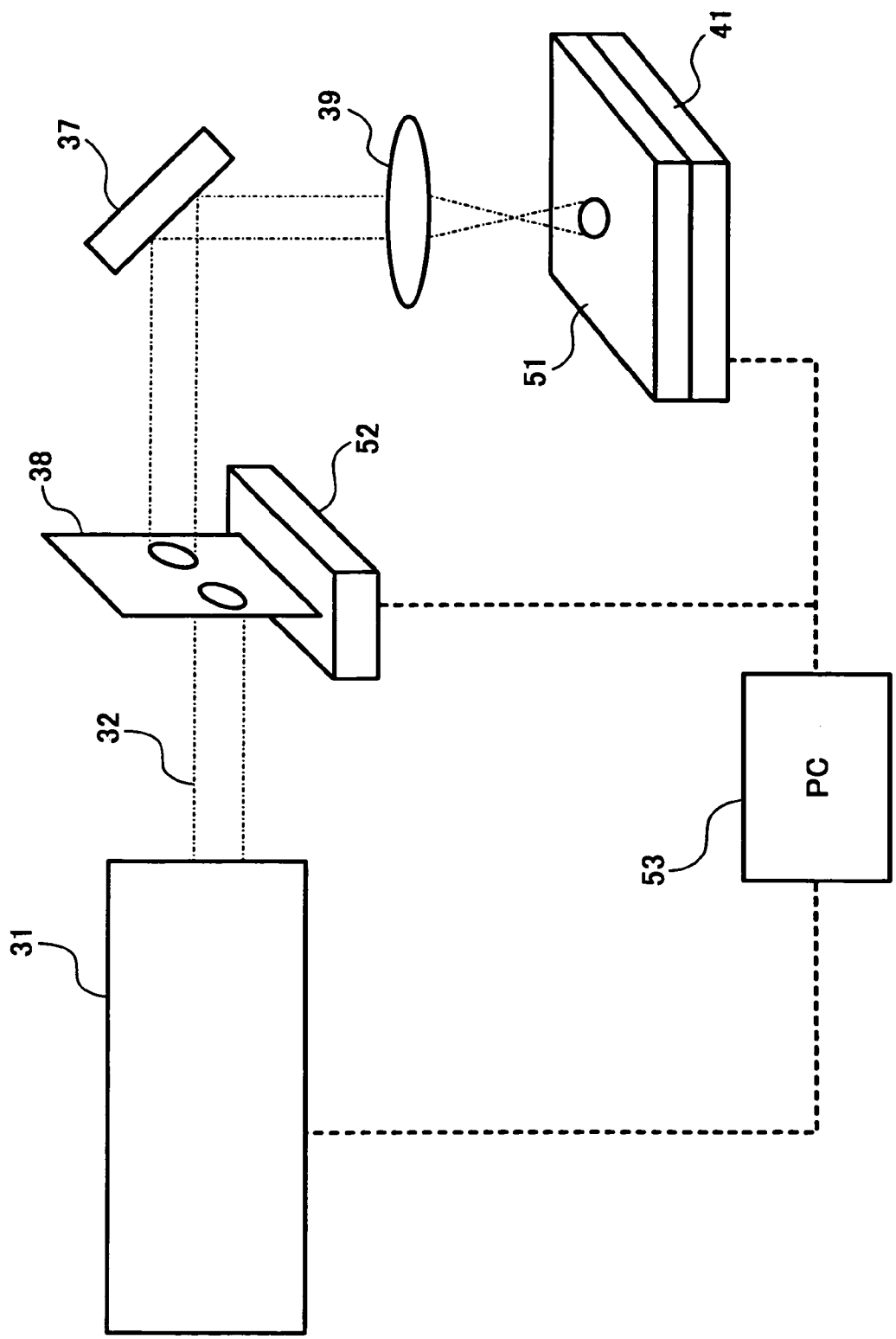
FIG. 6 is a block diagram of an apparatus for processing a three-dimensional structure in an eighth embodiment according to the invention.

As shown in FIG. 6, a process apparatus of the eighth embodiment comprises a laser process device 31 for emitting a process laser light 32; a mask 38 such as a photo-mask through which part of the process laser light 32 emitted from the laser process device 31; a mask movement stage 52 for moving the mask 38; a mirror 37 for reflecting the process laser light 32 passing through the mask 38; a focusing lens 39 for projecting in a reduced magnification a pattern image resulting from the process laser light 32 reflected by the mirror 37; a movement stage 41 for movably supporting a laminate 51 as a material to be processed in the embodiments 1 to 7; and a computer 53 for controlling the laser process device 31, the movement stage 41 and the mask movement stage 52.

Figure 7:
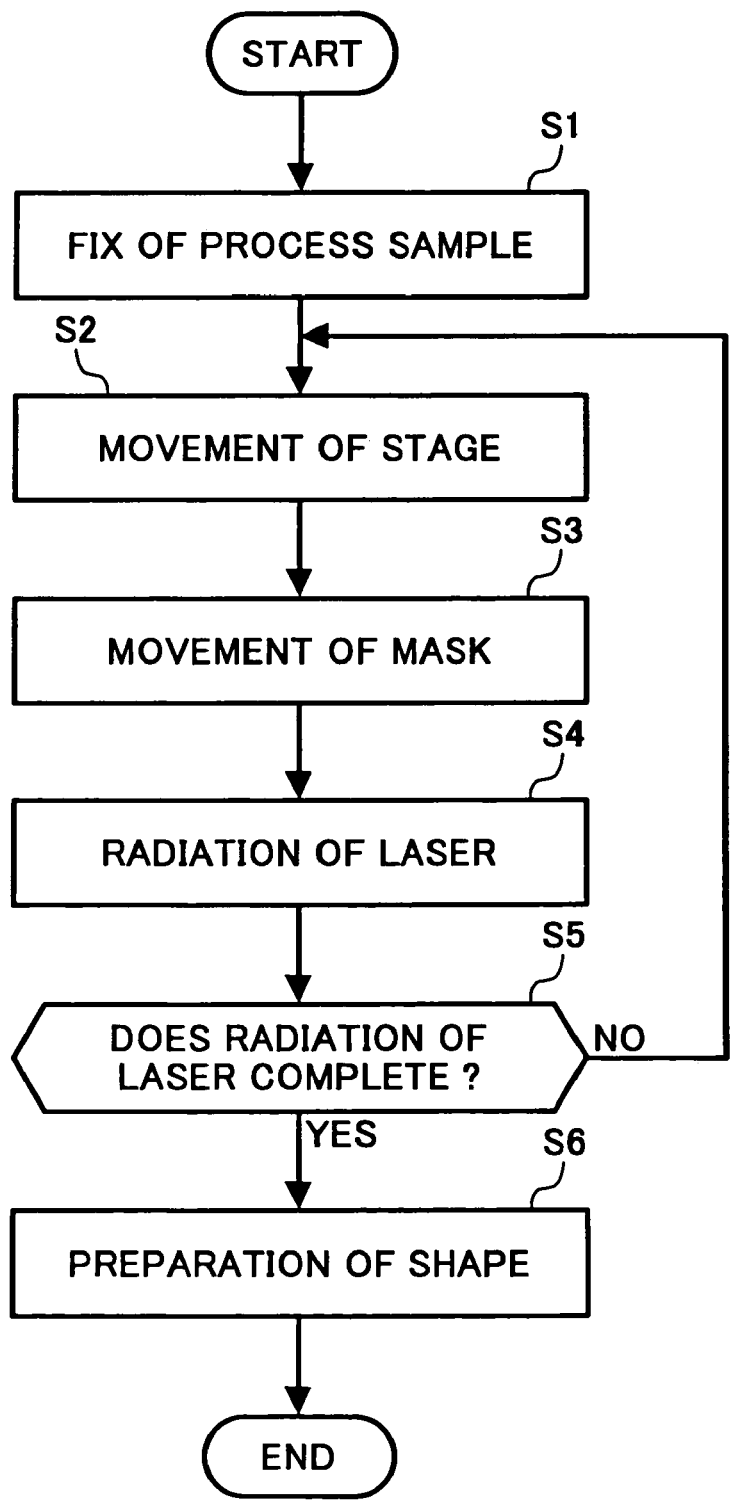
FIG. 7 is a flow chart of controlling the apparatus for processing a three-dimensional structure in the eighth embodiment according to the invention.

As shown in FIG. 7, the computer 53 locates the laminate 51 as a process sample in a predetermined position at step S1, and moves the laminate 51 in a process position using the movement stage 41 at step S2, and then moves the mask 38 in a predetermined position using the mask movement stage 52 at step S3.

Subsequently, a removed material section is formed in the laminate 51, by irradiating the process laser light 32 thereto from the laser process device 31 at step S4.

Subsequently, at step S5, it is judged whether or not the laser radiation is completed, and in the non-completed case, returning to step S2 to move the laminate 51 in another process position by moving the movement stage 41.

At step S6, the process for forming the profile is finished.

As can be seen, the process method of the eighth embodiment is similar to those of the first to fourth embodiments. Using the mask 38 prepared by etching a metal, evaporating chromium or the like, the process laser light is projected to the laminate in a reduced magnification or directly with mask contact to form a process pattern corresponding to the mask pattern.

In the laser process method of this embodiment, the process laser light 4 is spatial-selectively absorbed in the thin layer for absorption of laser light 2, as shown in FIG. 8(B). The light energy absorption in the thin layer for absorption of laser light 2 and the heat diffusion thereafter allow the laser-irradiated area to be increased in temperature, thereby enabling the thin layer for absorption of laser light 2 and the transparent layer 3 deposited thereon to be removed at the area. In this case, various profiles can be produced with the one-shot pulse radiation using an appropriately selected mask.

In the conventional abrasion process using the excimer laser, a structure formed on a photo-mask in an area of several mm square is projected in a reduced magnification of ⅓ to ⅕ onto the surface of a material to be processed to form a desired profile.

In this case, a non-uniform spatial distribution at the irradiated area results from the non-uniform intensity in the laser light and the diffraction effect in the mask edges. To avoid the non-uniformity, a number of expensive optical elements must be adjusted. In the conventional laser abrasion method, the non-uniform intensity distribution of the laser provides a three-dimensional profile corresponding to the intensity distribution of the irradiating laser light at the irradiated area. In the process method of this embodiment, however, all the areas of the layer where the heat diffuses are removed, thereby enabling a smooth bottom surface to be formed.

Moreover, in the conventional laser abrasion method, it is necessary that an expensive optics is used to eliminate the change in the beam shape due to the diffraction and interference at the edges of the mask opening in order to enhance the smoothness in the processed areas. In the method of this embodiment, however, the spatial-selected removal of material at all the irradiated areas can be achieved with highly smooth surfaces, even if there is non-uniform intensity distribution due to the diffraction and/or the interference.

In this case, it is possible to continuously process a wide area by controlling the position of the material to be processed with stages.

EXAMPLE 8

Figure 8:
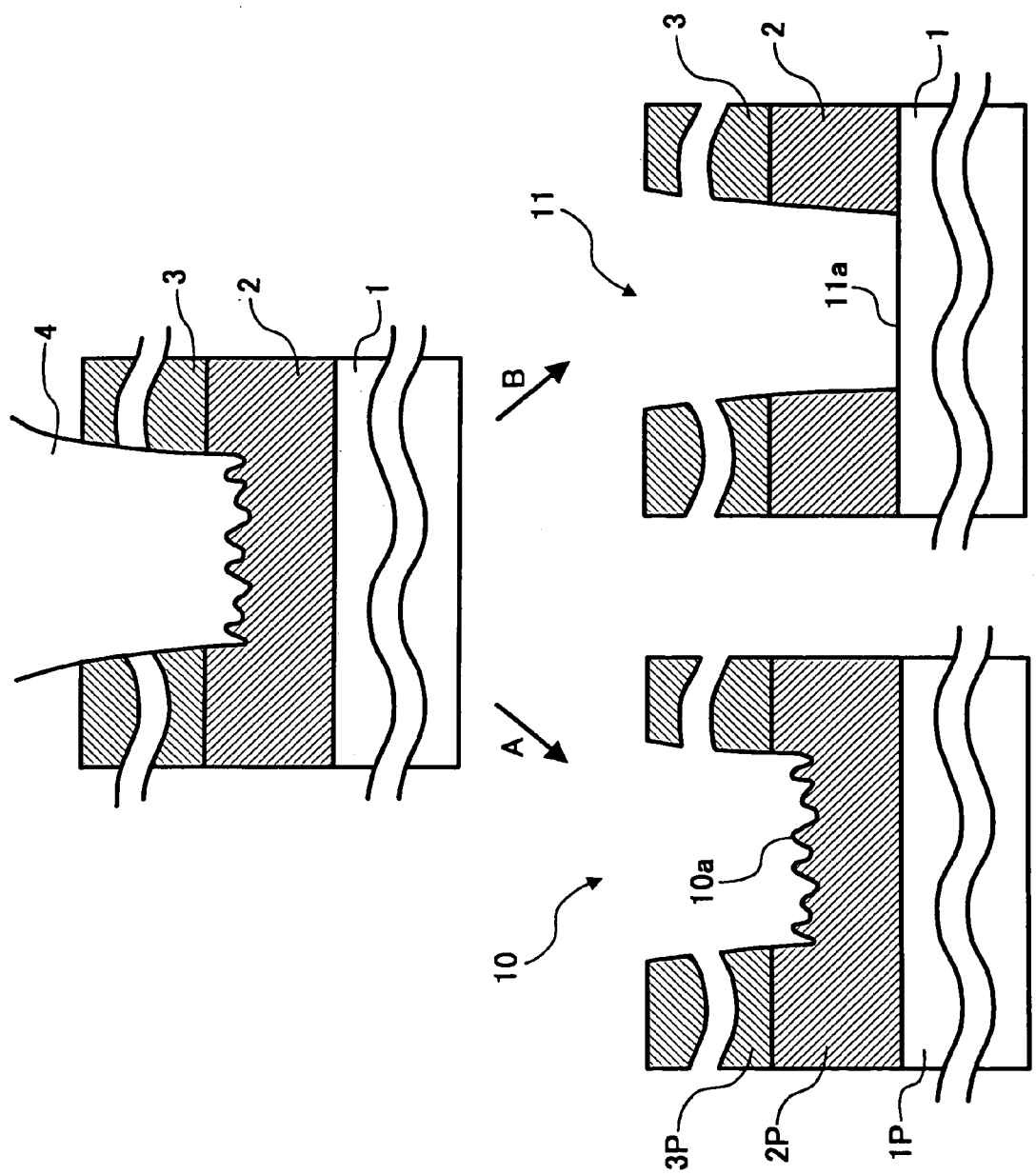
FIG. 8 is a sectional view of the eighth embodiment in a method for producing a three-dimensional structure according to the invention.

FIG. 8 shows a difference between the structure obtained by the method for processing a three-dimensional profile by transferring a mask image thereto in this embodiment (FIG. 8(B)) and the structure obtained by the conventional method for removing the material by abrasion (FIG. 8(A)).

In the case of applying the conventional laser abrasion process to a laminate as a structure consisting of thin layers, a desired part of a transparent layer 3P can be removed by the abrasion effect for the absorbing layer 2P on a substrate 1P. However, there remain uneven areas on the bottom surface 10a due to the non-uniformity in the laser light intensity distribution, the thermal property of the absorbing material, the orientation of the polymer and the like, as shown in FIG. 8(A).

On the contrary, the energy of the laser light is rapidly propagated in the thin layer for absorption of laser light 2, thereby increasing the temperature of the thin layer for absorption of laser light 2 at the irradiated areas in this embodiment. Accordingly, a rapid separation of the thin layer for absorption of laser light 2 from the flat substrate 1 takes place at the area, together with the transparent layer 3.

In this case, the thin layer for absorption of laser light 2 is separated at the whole irradiated areas, so that a smooth process is feasible since a smooth and flat surface 11a of the flat substrate 1 is exposed as a bottom surface.

When, for example, the width of process is several micrometers, and the thickness of the thin layer for absorption of laser light 2 is several tens nanometers, an increase in the width of process due to the heat transmission is negligibly small and therefore a high precision process can be realized.

Ninth Embodiment

Figure 9:
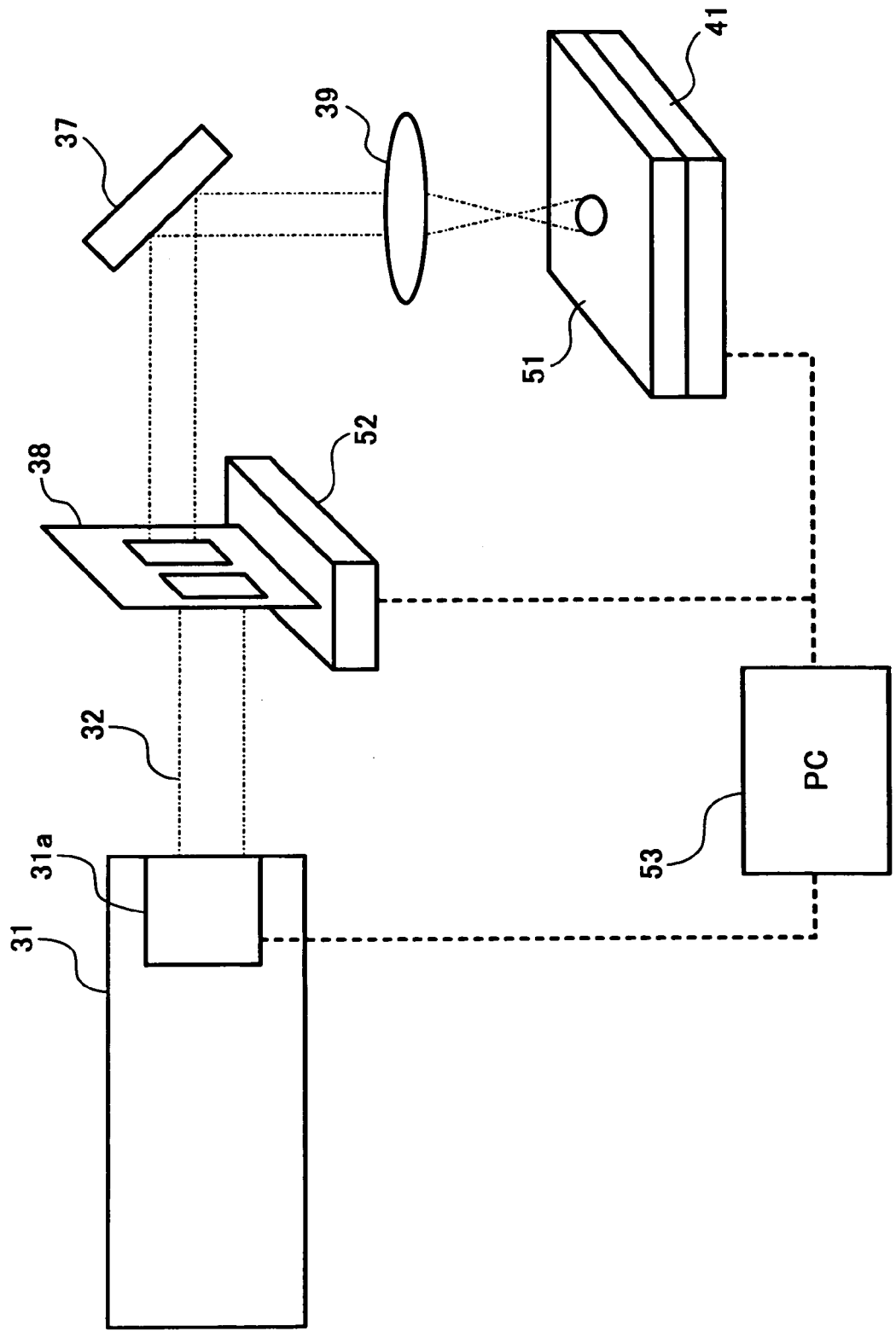
FIG. 9 is a block diagram of an apparatus for processing a three-dimensional structure in a ninth embodiment according to the invention.

A process apparatus shown in FIG. 9 comprises a laser device 31 for emitting a process laser light 32; a pockels cell 31a disposed inside the laser device 31; a mask 38 such as a photo-mask through which part of the process laser light 32 from the laser device 31 passes; a movement stage 52 for moving the mask 38; a mirror 37 for reflecting the process laser light 32 passed through the mask 38; a lens 39 for projecting a mask pattern image at a reduced magnification onto the surface of a laminate 51 of a material to be processed in the embodiments 1 to 7 by the process laser light 32 reflected from the mirror 37; a movement stage 41 for movable supporting the laminate 51; and a computer 53 for controlling the laser device 31, the movement stage 41 and the movement stage 52.

Figure 10:
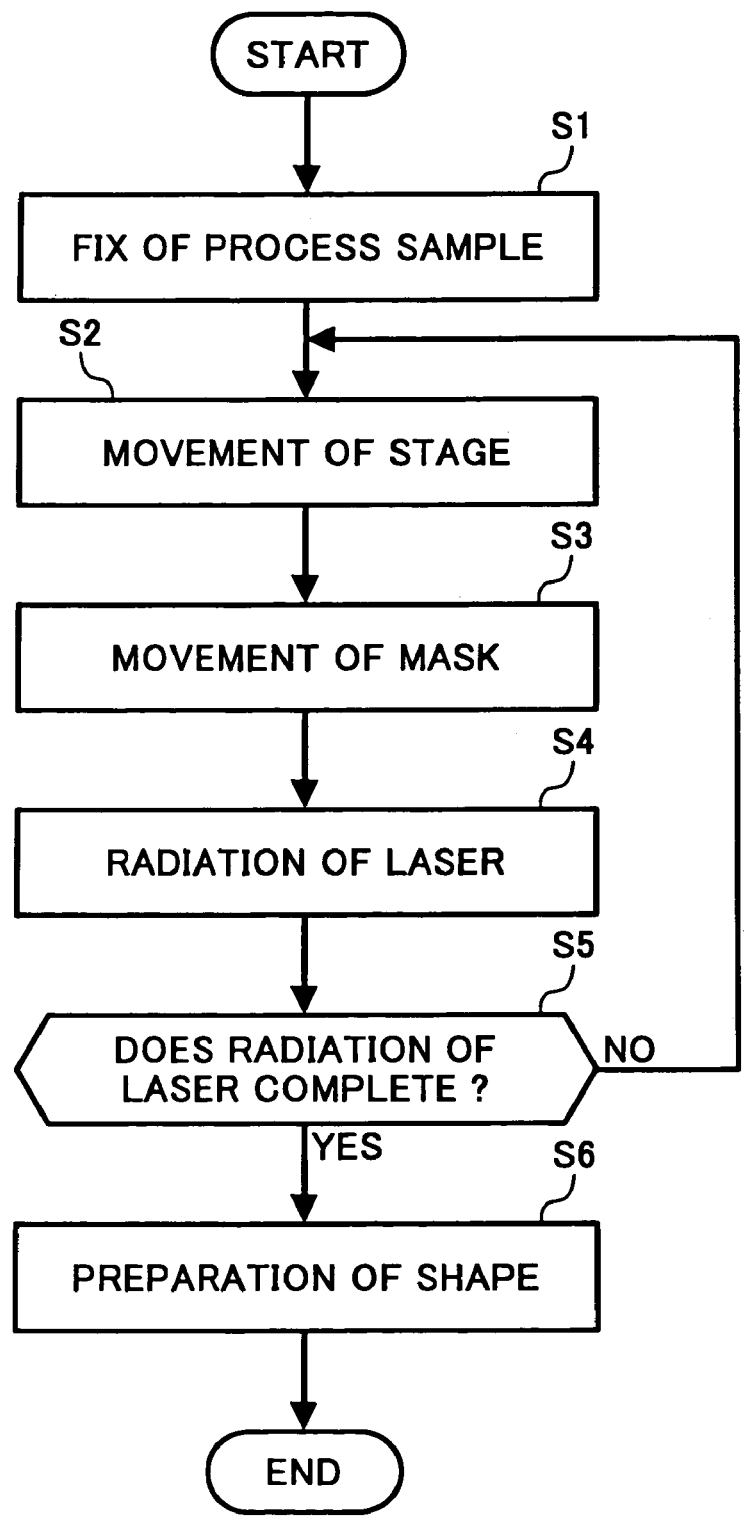
FIG. 10 is a flow chart of controlling the apparatus for processing a three-dimensional structure in the ninth embodiment according to the invention.

As shown in FIG. 10, the computer 53 locates the laminate 51 as a process sample at a predetermined position at step S1, and moves the laminate 51 to the process position by operating the movement stage 41 at step S2, and further moves the mask 38 in a predetermined position by operating the movement stage 52.

Subsequently, at step S4, the process laser light 32 emitted from the laser device 31 by controlling the pockels cell 31a is irradiated onto the laminate 51 to form the removed material section.

Subsequently, at step S5, it is judged whether or not the laser radiation is ended. In the case of being not ended, returning to step S2, the laminate 51 is moved in the next process position by operating the movement stage 41.

At step S6, the processing of the profile is finished.

The process method of this embodiment is a mask projection type laser processing method. The laser irradiating position can spatial-selectively be altered by using the photo-mask 38, which is made of a transmission type liquid crystal, a reflection type mirror element or the like. The processing of the profile is carried out by controlling the laser radiation and the shape of mask openings in a sychronized manner.

In the ninth embodiment, the mask of a transmission type liquid crystal having, e.g., a high transparency for the process laser light is used by synchronizing it with the process laser light, and so the mask shape is altered in accordance with the laser radiation period, switching between a first period and a second period.

In this case, a reflection type mirror array elements used in a projector can also be employed as another variable mask, if the elements have a high reflectivity for the process laser light.

With this structural arrangement, the digital depth control is feasible; for instance, along with the shifting of the laser radiation position, the depth of process can be increased by increasing the number of laser pulse shots.

In this case, the same intensity profile can be used for the process laser light, so that a high speed process can be attained with a reduced cost, compared with the process method in which a plurality of masks are sequentially changed.

EXAMPLE 9

FIG. 11 shows an embodiment in which a transmission type liquid crystal mask is used.

A process laser light having an intensity distribution 12 shown in FIG. 11(A) is irradiated to a transmission type liquid crystal mask 13a. The laser intensity after passing through the mask can spatially be altered by means of the transmission type liquid crystal mask 13a and a polarizing beam splitter interposed between the mask and the radiation area. In this case, the intensity of the transmitted light can be changed from the maximum to about 0 by controlling the orientation plane of the liquid crystal. In this embodiment, the intensity of the light passed through the mask has a binary value, the maximum or minimum value. However, more than two values of the intensity can be allowed in order to obtain an optimum process state. By projecting the transmitted light onto the surface of the material to be processed 14a at a reduced magnification, a three-dimensional pattern is formed using a first laser light. Thereafter, the mask shape is changed into a second mask shape 13b before the second laser radiation period, as shown in FIG. 11(B), and then a part of the material to be processed 14b is removed, using the process laser light passed through the second mask shape 13b. At a position at which the first laser light and second laser light are irradiated, two layers are removed, whereas at a position at which one of these is irradiated a single layer is removed. By repeating these procedures, a three-dimensional profile of the material to be processed 14c can be obtained, as shown in FIG. 11(C).

The transmission type liquid crystal 13a permits producing a three-dimensional profile in a high speed and makes it possible to produce any arbitrary by synchronizing the variation of the transmitted light intensity with the timing of the laser radiation.

Hence, such a three-dimensional product can be manufactured with a reduced cost without usage of many masks.

Tenth Embodiment

A laser process method of the tenth embodiment is the same as those of the first to fourth embodiments. In the method, a process laser light is focused and a round pattern is produced by one-shot pulse of the focused light beam. In this case, the light intensity at an irradiated area can be adjusted by means for varying the intensity of the laser light.

A laminate as a structure of thin layers is disposed on a movement stage and the process position is determined with a high speed by the movement stage.

In this case, it is desirable that the process laser light has a Gaussian intensity distribution and that an objective lens disposed so as to have a long distance between the outer lens surface and the process position is used to focus the process laser light.

Moreover, it is preferable that a focus adjusting mechanism is included in movement means in order to avoid the position deviation at the laser process position in the laser irradiating direction.

In the process method according to the tenth embodiment, a process laser light, which has a general Gaussian intensity distribution in a single mode laser, is focused and irradiated to the surface of a thin layer for absorption of laser light. In this case, the irradiated position is controlled by a linear stage and a rotation stage, and determined by synchronizing the movement of these stages with the process laser light. The direction of laser radiation relative to the direction toward the thin layer for absorption of laser light is also determined by synchronizing these stages with the laser radiation.

Hence, the laser light having a Gaussian intensity distribution is focused and irradiated onto the surface of the thin layer for absorption of laser light, so that the heat is propagated in the thin layer for absorption of laser light and the temperature rises in the area of the thin layer for absorption of laser light, thereby causing the thin layer for absorption of laser light to be separated from the lower surface. Since the thin layer for absorption of laser light and the transparent layer are removed only at the irradiated area, the profile after the process becomes a cylindrical shape and therefore a bore having a smooth bottom surface can be processed.

In this case, the light absorbing area in the layers, the energy of light and the heat transmitting area in the layers can be adjusted by controlling the laser light radiation intensity, thereby enabling the diameter of the bore to be adjusted.

By moving the material to be processed in synchronization with the laser radiation, the bores can be sequentially formed, and a plurality of three-dimensional profiles can be produced in a high rate by rapidly shifting the material to be processed.

EXAMPLE 10

Referring now to FIG. 12, the variation of the processed shape due to the energy of the focused light will be described.

In the laser process by this embodiment, the removable of the thin layer for absorption of laser light can be attained by heating the thin layer for absorption of laser light. In this case, the intensity of the incident laser light has to be set more than a threshold value in order to locally remove the thin layer for absorption of laser light and the transparent layer.

Since the light having an intensity of more than the threshold value provides a removal of the thin layer for absorption of laser light and the light having an intensity of less than the threshold value provides no removal, an incident light is formed by focusing the laser beam having a light intensity of, e.g., a Gaussian profile, thereby the processed area can be controlled by the laser light intensity.

For instance, when a laser having a Gaussian intensity distribution is irradiated onto the surface of a material to be processed, as shown in FIG. 12(A), the laser light having an intensity of more than the threshold provides a three-dimensional structure 15a. A decrease in the laser light intensity using intensity adjusting means, as shown in FIG. 12(B), provides a three-dimensional structure 15b whose size is reduced relative to the structure 15a in FIG. 12(A).

A further decrease in the laser light intensity, as shown for the intensity distribution in FIG. 12(C), provides a very fine three-dimensional structure 15c, which can hardly be obtained with the conventional exposure method.

Eleventh Embodiment

A process method of the eleventh embodiment is the same as those of the first to fourth embodiments. In this case, a process laser light is focused in one direction by a combination of cylindrical lenses to generate a beam in the form of a straight line, and then the beam is spatial-selectively irradiated onto a thin layer for absorption of laser light. A laminate as a material to be processed is moved by moving means such as stage or the like in synchronization with the laser beam.

A three-dimensional structure having smooth bottom surfaces can be sequentially obtained by repeating the radiation of laser light and the movement of the stage.

In the process method according to the eleventh embodiment, a line-shaped pattern is formed on the surface of the structure by irradiating the process laser light. In this case, the laser beam has a Gaussian intensity distribution in the transversal direction and a uniform intensity distribution in the longitudinal direction, as shown in FIG. 12(A). The surface of the thin layer for absorption of laser light is irradiated by a process laser light having such intensity and then the heat is thermally diffused in the layer, so that the temperature of the thin layer for absorption of laser light rises and then the exfoliation takes place in the bottom surface. In this case, the removal takes place in the thin layer for absorption of laser light and the transparent layer at the irradiated area, so that bores having a smooth bottom surface can be obtained.

Since the exfoliation is carried out over all the area in the thickness direction, a profile having a smooth bottom surface can be obtained even if the laser beam having a Gaussian intensity distribution.

In conjunction with the above, the control of the laser light intensity makes it possible to control the light absorbing area in the thin layer for absorption of laser light, the energy and the heat diffusion area of the thin layer for absorption of laser light, thereby enabling the process width to be controlled.

The movement of the laminate in synchronization with the laser radiation permits sequentially producing bores, and thus a line shaped profile can be produced in a high speed.

By applying this method, a grating as a diffraction type optical element can easily be produced, and by applying the positional alignment of multi-layer, a multi-level diffraction grating can easily be produced only with a movement of the material to be processed.

EXAMPLE 11

Figure 13A:
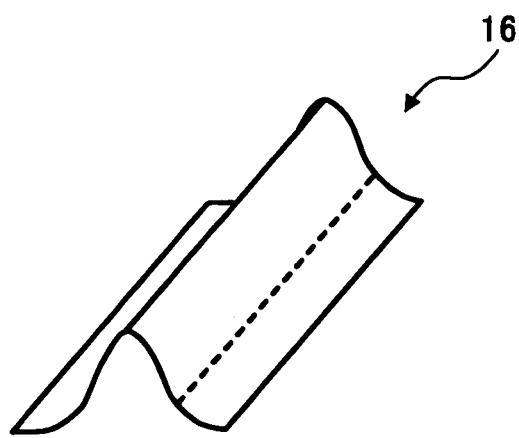
FIG. 13 is a drawing showing an eleventh embodiment in a method for producing a three-dimensional structure according to the invention.

A process laser light beam having an intensity distribution 16, as shown in FIG. 13(A), is formed, using a cylindrical lens or mirror. A spatial-selective radiation of the process laser light is continuously carried out either by scanning the laser beam or by moving the material to be processed, in which case, the timing of the laser light radiation and the radiation position is controlled in synchronization with each other by means of movement means to radiate the process laser light onto a desired position in the form of a line.

Figure 13B:
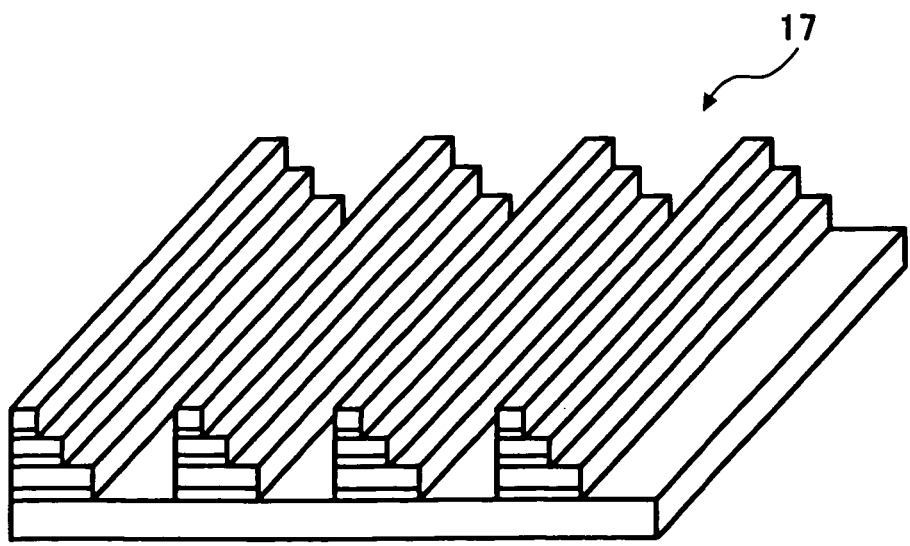

With a scanning pitch from several micrometers to several hundreds micrometers, for example, a multi-binary type diffraction grating 17 shown in FIG. 13(B) or a master form thereto can be produced.

Twelfth Embodiment

A process method of the twelfth embodiment is the same as those of the first to fourth embodiments. The process laser light is generated either by Q switching the fundamental from an excimer laser having a pulse width of less than 100 ns or a solid laser such as Nd: YAG, Nd: YLF, or the like, or by introducing the laser light into, for instance, a non-linear optical medium to produce a harmonic. At present, a high power laser light source can be selected from the above-mentioned lasers and the thickness of the thin layer for absorption of laser light is preferably set to be less than the width of the laser-irradiated area.

In particular, light from a laser having a pulse width of less than 100 ns is used as the process laser light in order to reduce the thermal diffusion area.

It is known that the thermal diffusion rate due to the heat propagation in a material is given by equation (1), as described above. From the equation, it follows that the thermal diffusion length at time $\tau$ after irradiated in a material having a thermal diffusion rate d is L.

Pulse laser light having a pulse width of less than 100 ns provides a thermal diffusion distance of less than 1 micrometer in the thin layer for absorption of laser light for normal ceramic, polymer materials and the like. Accordingly, the usage of the process laser light having a pulse width of greater than the above pulse width permits restricting the thermal diffusion range, thereby enabling the deformation due to the thermal diffusion to be reduced.

When the thickness of the thin layer for absorption of laser light is less than the thermal diffusion distance L and the area of laser radiation is greater than L, the removal of thin layers only at the irradiated area and the process of a three-dimensional structure can be carried out in a highly precise manner.

When the radiation area of the process laser light is in a range from sub-micron to several hundred micrometers and the thickness of the layer is of order of sub-micron, a three-dimensional profile having a smooth bottom surface, whose area is substantially the same as the laser radiation area, can be obtained.

EXAMPLE 12

Equation (1) for diffusion represents the range within which energy impinged at a moment diffuses after a certain time. The thermal diffusion rates for various materials are listed in Table 1.

TABLE 1

| Material | Thermal diffusion rate (d) |
|---|---|
| Metal | $20-200 \times 10^{-6}$ |
| Glass | $0.3-2 \times 10^{-6}$ |
| Polymer | $0.2-0.5 \times 10^{-6}$ | where the thermal diffusion rate d at ordinary temperature is shown for typical metals, glasses and polymers.

The thermal diffusion range obtainable from the pulse width of the process laser light is listed for the above materials in the following Table 2:

TABLE 2

| Thermal diffusion range (μm) | 1 ps | 1 ns | 1 μs |
|---|---|---|---|
| Metal | ~0.01 | ~0.3 | ~10 |
| Glass | 0.001 | 0.03 | 1 |
| Polymer | <0.001 | 0.02 | 0.5 |

As can be seen, a pulse width of less than 100 ns in the process laser light ensures a thermal diffusion range of <1 μm for these typical materials. Therefore, when the layer thickness is less than the above value, the heat is completely transmitted inside the thin layer for absorption of laser light in the thickness direction, thereby allowing the thermal removal to be realized.

Accordingly, a three-dimensional structure having a smooth bottom surface can be processed in a high precision.

Thirteenth Embodiment

A process method of the thirteenth embodiment is the same as those of the first to fourth embodiments. In particular, the fundamental or the harmonic of Ti: sapphire laser having a pulse width of order of sub-pico seconds, or the fundamental or the harmonic of a solid laser such as Nd: YAG laser is employed as a process laser light, and a layer of metal, such as Ni, Au, Al or the like is used as a thin layer for absorption of laser light. It is desirable that the thickness of the metal layer is more than, or preferably several times greater than the penetration range of the laser light.

In the thirteenth embodiment, a laser having extremely small pulse width less than 1 ps is used. In accordance with the recent development, such a laser can be realized typically by Ti: sapphire laser, which has a center resonant wavelength in the vicinity of 800 nm and a typical pulse width of several tens fs to about 200 fs.

It is known that the laser having such extremely small pulse width provides a particularly short period of radiation to the material, thereby allowing the thermal deterioration to be suppressed and a high precision process to be realized. See, for example, the following article: (Appl. Phys. A 63, 109–115 (1996)).

It is also known that the abrasion process is feasible even for materials, such as metals, having a high thermal conductivity by utilizing the laser having a very small pulse width.

Figure 14:
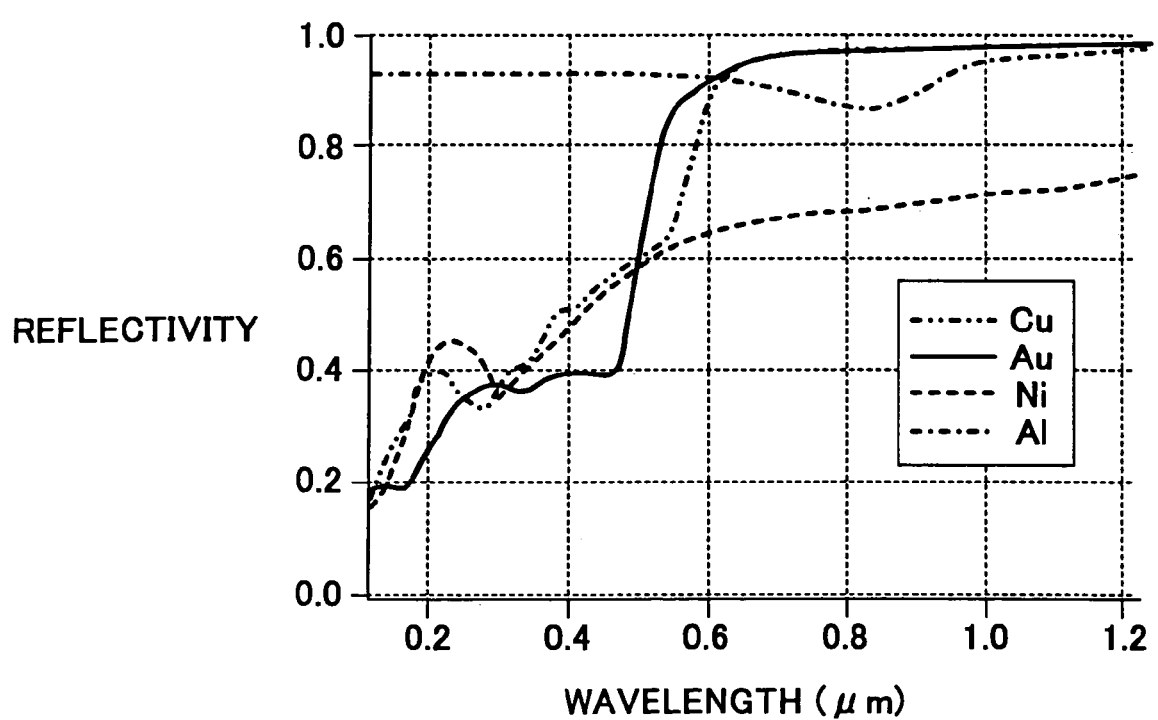
FIG. 14 is a diagram showing the reflectivity of typical metals in a range of ultra violet to near-infrared wavelength.

Moreover, it is known that metal has a high absorption coefficient over a wide spectral range from ultraviolet to near infrared light, and the photo-absorption takes place inside an extremely thin layer of the surface. For typical metals, the light penetrating range is shown in FIG. 5, and the reflectivity at various wavelengths is further shown in FIG. 14. The energy of light, which is not reflected by a metal, is absorbed in the vicinity of the metal surface, and immediately transformed into heat within the area represented by the penetration range shown in FIG. 5.

During a period less than a picosecond, the electron temperature is not same as the lattice temperature, and these temperatures can be expressed by a two-temperature diffusion equation, as described in the above-mentioned article.

The energy of laser light is transferred to the lattice system in several pico-seconds and then propagated therein as heat, thereby causing the removal to take place in the laser light-irradiated area.

In accordance with the present invention, the metal material is deposited as a thin layer for absorption of laser light and therefore the range of thermal diffusion is limited. As a result, the thermal diffusion in the metal is restricted, thereby enabling the metal layer to be removed from the flat surface with a low light energy.

Normally, metals have an extremely large diffusion range, and therefore the width or distance of the removed area from the laser-irradiated position is expanded However, using light having a pulse width of order or sub-pico second, the diffusion width can be maintained within less than 1 micrometer for typical metals.

Light emitted from the Ti: sapphire laser is near infrared light and it is applicable to various transparent materials, such as polymers, ceramics or the like. Metals, which are available with a low cost and a high productivity, can be employed as an absorbing material.

The harmonic of the laser corresponds to visible light and provides the same trend as above. The second harmonic permits producing a finer structure and also employing inexpensive and high precision optical elements in the focusing system.

Fourteenth Embodiment

By using an element produced with a process method according to one of the first to thirteenth embodiments, duplicates of the element are produced. More specifically, a metal film is applied to the surface of the element and then an inverse forming die is formed therefrom by the electroforming method. Thereafter, using the inverse forming die as a forming die, it is transferred to a polymer material by the forming method to form a duplicate thereof. The duplicate thus formed can again be used as a forming die.

With such a procedure, either a profile corresponding to the processed structure or the inverse profile can be produced for the other material.

In the method for processing a three-dimensional shape according to the fourteenth embodiment, a duplicate is formed with the aid of the electroforming method with respect to the three-dimensional structure produced by the process method of one of the above-mentioned embodiments. Moreover, using the duplicate of metal material, duplicates of polymer or glass material are formed by the forming method. This is applicable not only to the molding, but also to the forming die for photo-curing resin used in the 2P method and to the forming die used in the Sol-Gel method.

With this method, a three-dimensional structure can be obtained for a material different from the initially processed material. For instance, there is an advantage that, even if a material to be processed is not transparent, the usage of a different material to form the forming die for a transparent polymer permits producing transmission type elements with duplication.

The laser process method requires a long time for a wide area to be processed, and has a drawback of increasing the cost. However, by producing a metal mold and by producing duplicates for the mold, three-dimensional structures can be massively produced.

EXAMPLE 14

FIG. 15 shows steps of duplicating a structure in accordance with the method of this embodiment.

Figure 15A:
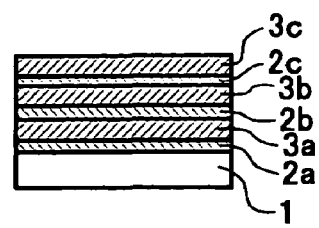
FIG. 15 is a sectional view of a fourteenth embodiment in a method for producing a three-dimensional structure according to the invention.

As shown in FIG. 15(A), a step for applying a thin layer is firstly executed to form a structure.

Figure 15B:
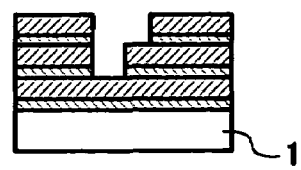

Subsequently, a three-dimensional structure is formed by a process laser light, as shown in FIG. 15(B).

Figure 15C:
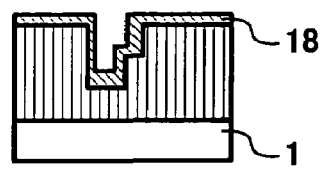

Subsequently, a metal layer 18 for producing a surface electrode in the electroforming is formed by sputtering, as shown in FIG. 15(C).

Figure 15D:
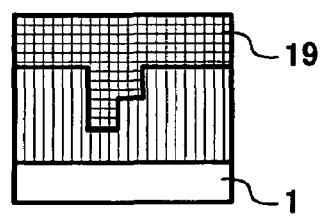

Subsequently, a metal layer 19 of Ni is applied thereto by the electroforming method, as shown in FIG. 15(D).

Figure 15E:
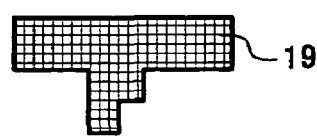

Subsequently, an original or master form f Ni is removed from the structure thus processed, as shown in FIG. 15(E).

Figure 15F:
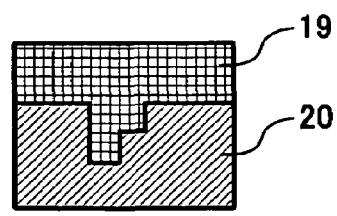
Figure 15G:
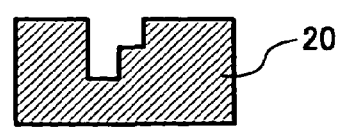

Subsequently, plastic material 20 is molded using the Ni master form as an original form, as shown in FIG. 15(F). Transparent structure can be produced by polycarbonate material. Moreover, duplicates of photo-curing resin can also be produced by transfer method (2P method) using an UV light.

By the above procedures, the structure having the same shape as that by the laser process can be produced with low cost.

Fifteenth Embodiment

A method for producing a duplicate according to the embodiment 15 is the same as that according to the embodiment 14, in which case, the duplicate is used as a stamper for videodisk. For this purpose, a structure including pits P and grooves for a videodisk in the form of a disk can be produced with the method according to one of the first to fourth embodiment to form a stamper for the videodisk by a method for sputtering Ni layer, electro-forming Ni layer and separating layer.

In the conventional method for preparing a stamper for videodisk, a photosensitive material is applied onto a glass substrate by means of a spinner or the like and then baked. Thereafter, the substrate is exposed by a UV laser, such as He—Cd laser, and then a three-dimensional pattern or the photosensitive material is produced after fixing and developing. Finally, a stamper is produced by applying a metal layer thereto with the electroforming method and the separating process.

In this case, there are specific problems such as a difficulty in determining the conditions for the exposure, fixation and development, the pollution due to the wash, and environment pollution due to the solvent.

In the method for processing a structure according to this embodiment, the complicated processes can be simplified, because the structure can be directly formed only by scanning the process laser light. In the conventional exposure method, a photosensitive material has to be illuminated by a UV laser having a high sensitivity for the material, whereas in the method according to the present invention, the transparent layer and the thin layer for absorption of laser light can be selected from a variety of materials without any special precaution about the laser light source.

Since, moreover, the three-dimensional processing is carried out by means of one-shot laser light pulse, a high-speed process can be attained using light having a low energy.

EXAMPLE 15

Figure 16:
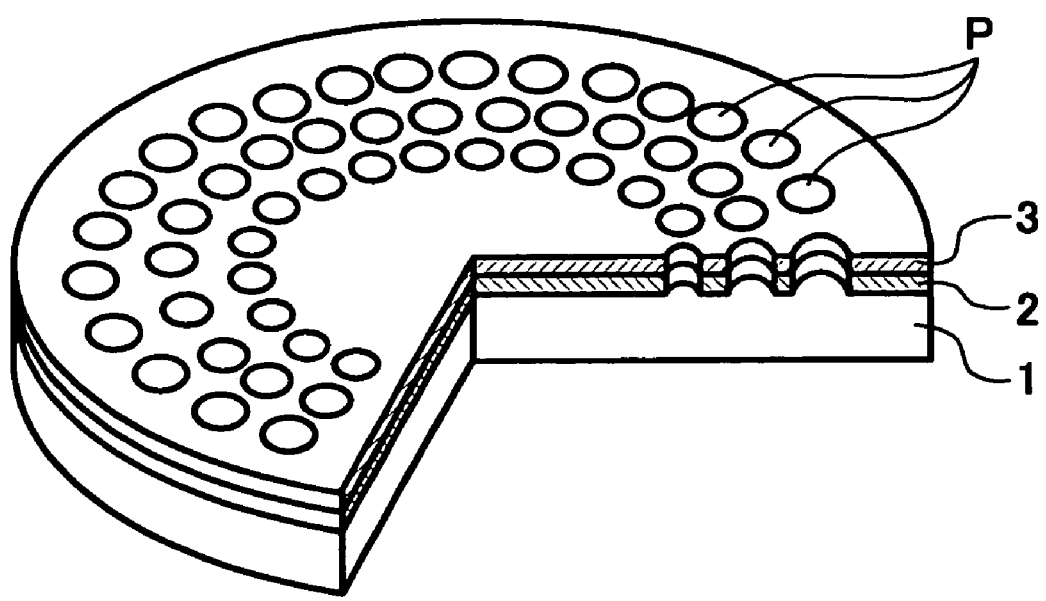
FIG. 16 is a perspective view of a stamper disk for an optical disk as an example of a three-dimensional structure in a fifteenth embodiment according to the invention.

FIG. 16 shows an example of a stamper for videodisk according to the present invention.

As shown in FIG. 16, a thin layer for absorption of laser light 2 is deposited onto a flat substrate 1 of glass, and further a transparent layer 3 is applied thereon. Then, a process laser light focused by an objective lens having a large NA is irradiated during a short time onto the surface of the transparent layer, in which case, a pit P is formed by one-shot pulse illumination. By rotating the substrate with a rotation stage or by moving the substrate in the circumferential direction with a linear stage, the structure including pits are continuously formed. In this case, it is desirable that the total thickness of the transparent layer 3 and the thin layer for absorption of laser light 2 of metal material is determined by using a reference light and it is preset to be ¼ of the wavelength of the reference light.

Furthermore, the process laser can be activated by adjusting the timing of radiation in synchronization with the movement of the rotation/movement means, and the process laser light is irradiated after adjusting the light intensity in accordance with the size of the hole.

In this case, a number of holes and/or a number of original forms can be simultaneously formed by splitting the laser light.

A duplicate can be produced from the original form produced by the method according to this embodiment, and it can be used as a stamper by further duplicating the duplicate.

Sixteenth Embodiment

A duplication method of this embodiment is the same as that of the fourteenth embodiment. In this case, the duplicate is used as a master for diffraction type optical elements. A number of hole profiles is formed on a flat disk with the process method according to one of the first to fourth embodiments, and multi-level diffraction elements are formed in the form of a three-dimensional shape by shifting the process position with movement means such as a stage or the like, or phase modulation type diffraction grating is formed by processing the shape with the aid of a computer.

In this case, the total thickness of the transparent layer and the thin layer for absorption of laser light is set to be of order of $\lambda/n$ where $\lambda$ is the wavelength of light irradiating the optical element.

Conventionally, a diffraction type optical element is formed in a profile having a plurality of heights, for instance, by the combination of resist pattern forming means and etching means in a multi-stage. In this process, a complicated and precise positioning of the masks is required, thereby causing increasing the process cost.

In the process method of this embodiment, the profile is directly formed only by scanning the process laser light, thereby making it possible to simplify the complicated steps in the conventional process.

In the conventional exposure method, it is necessary to use a photosensitive material and to employ a UV laser, which is highly sensitive to the photosensitive material. In the method of this embodiment, however, required materials can be selected from various materials for the transparent layer and thin layer for absorption of laser light.

Moreover, the process depth in a three-dimensional profile can be determined by the number of laser radiation events, and master or matrix for diffraction elements, binary optical elements or the like can easily be produced either by applying a metal layer to the processed material or by applying the electroforming method thereto.

Seventeenth Embodiment

A laser process apparatus in this embodiment comprises a process laser; a ½-wavelength plate; laser light intensity regulating means such as a polarizing beam splitter or a ND (neutral density) filter; and laser light forming means such as lenses and mirrors or the like, wherein laser light radiation position is spatially determined and the laser process method according to one of the first to sixteenth embodiments is employed.

In this case, it is desirable that means for controlling the number of laser radiations, for instance, shutter is disposed inside or outside the laser process apparatus and that the laser light is irradiated in synchronization with a movement stage onto which a material to be processed is mounted.

The laser process apparatus permits processing a three-dimensional structure having a smooth bottom surface.

It is noted that such a structure can only be produced with difficulty by a process apparatus in the prior art.

Furthermore, a three-dimensional profile can easily be processed by controlling the laser radiation, and a large area process can be made only by moving the stage.

EXAMPLE 17

Figure 17:
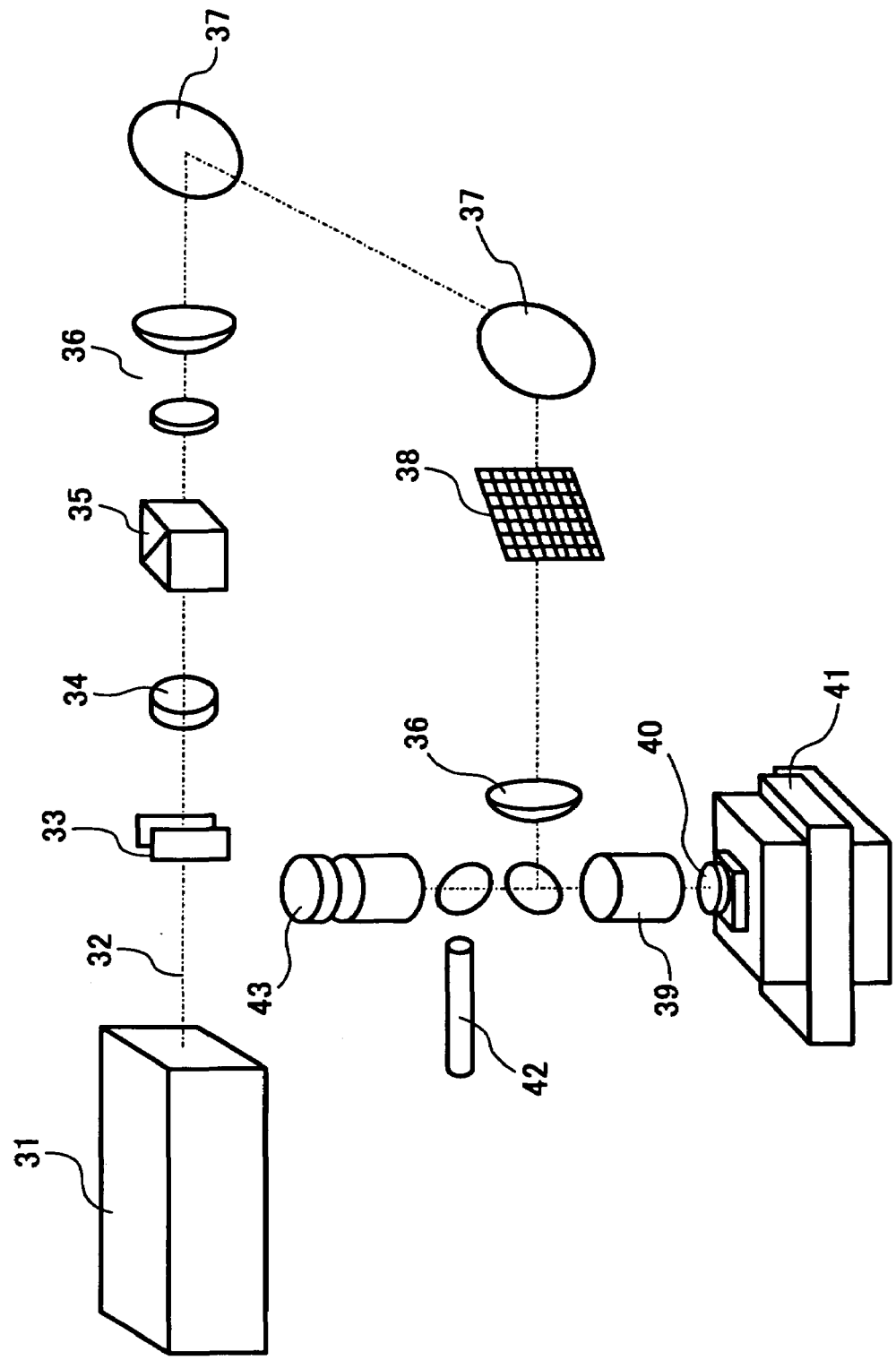
FIG. 17 is a block diagram of an apparatus for processing a three-dimensional structure in a seventeenth embodiment according to the invention.

As shown in FIG. 17, a process laser light 32 emitted from a laser process apparatus 31 is introduced into a ½-wavelength plate 34 after controlling the radiation time with an external shutter 33, wherein a rotation of the ½-wavelength plate 34 causes the polarization plane of the process laser light 32 and the axial direction of the ½-wavelength plate 34 to be changed, and then the beam intensity is controlled by a polarizing beam splitter 35. Thereafter, the process laser light 34, whose intensity is thus controlled, is reformed as for the beam shape by forming lenses 36 as the following lens system and by a mirror system 37, and then transferred onto a mask 38. The process laser light 32 passed through the mask 38 is focused by a condenser lens 39 and then projected in a reduced magnification onto the surface of a laminate 40 as a material to be processed used for the layer application material. The laminate 40 as material to be processed is positioned in a process position by a movement stage 41. In order to observe the laminate in the process position, an observation apparatus including an illumination apparatus 42 is disposed and a state of the element can be monitored by a CCD camera 43.

With this system, a three-dimensional structure having a complicated profile can easily be processed.

Figure 18:
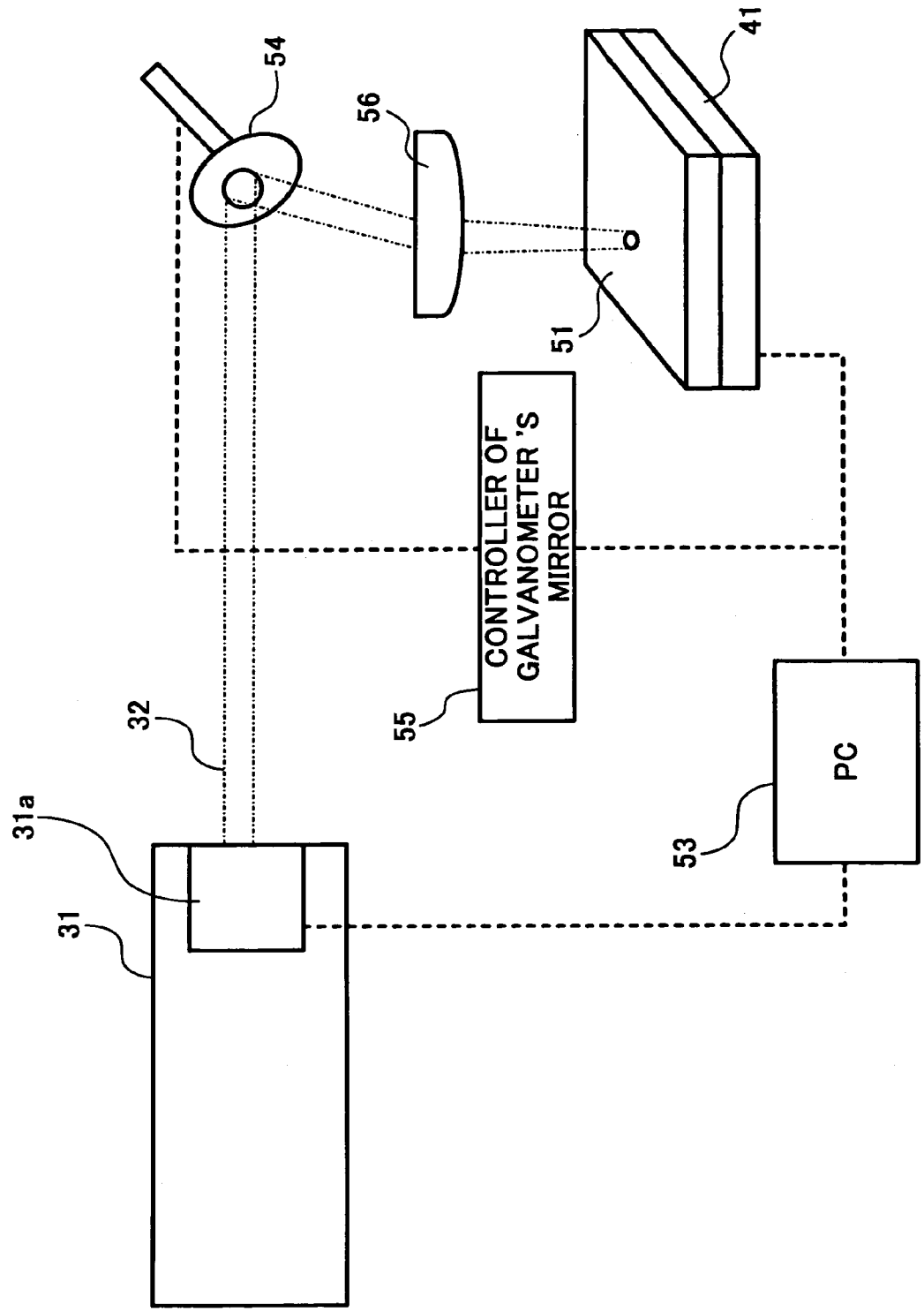
FIG. 18 is a detailed block diagram of the apparatus for processing a three-dimensional structure in the seventeenth embodiment according to the invention.

As shown in FIG. 18, the process apparatus includes a laser device 31 for emitting the process laser light 32; a pockels cell 31a disposed in the laser device 31; a galvanometer mirror 54 for scanning the process laser light 32 emitted from the laser device 31; a fθ lens 56 for scanning the process laser light 32 reflected by the galvanometer mirror 54 in a constant velocity; a movement stage 41 for mounting the laminate 51 as a material to be processed according to one of the first to seventh embodiments; and a computer 53 for controlling the galvanometer mirror 54 via the laser device 31, movement stage 41 and a galvanometer controller 55.

Figure 19:
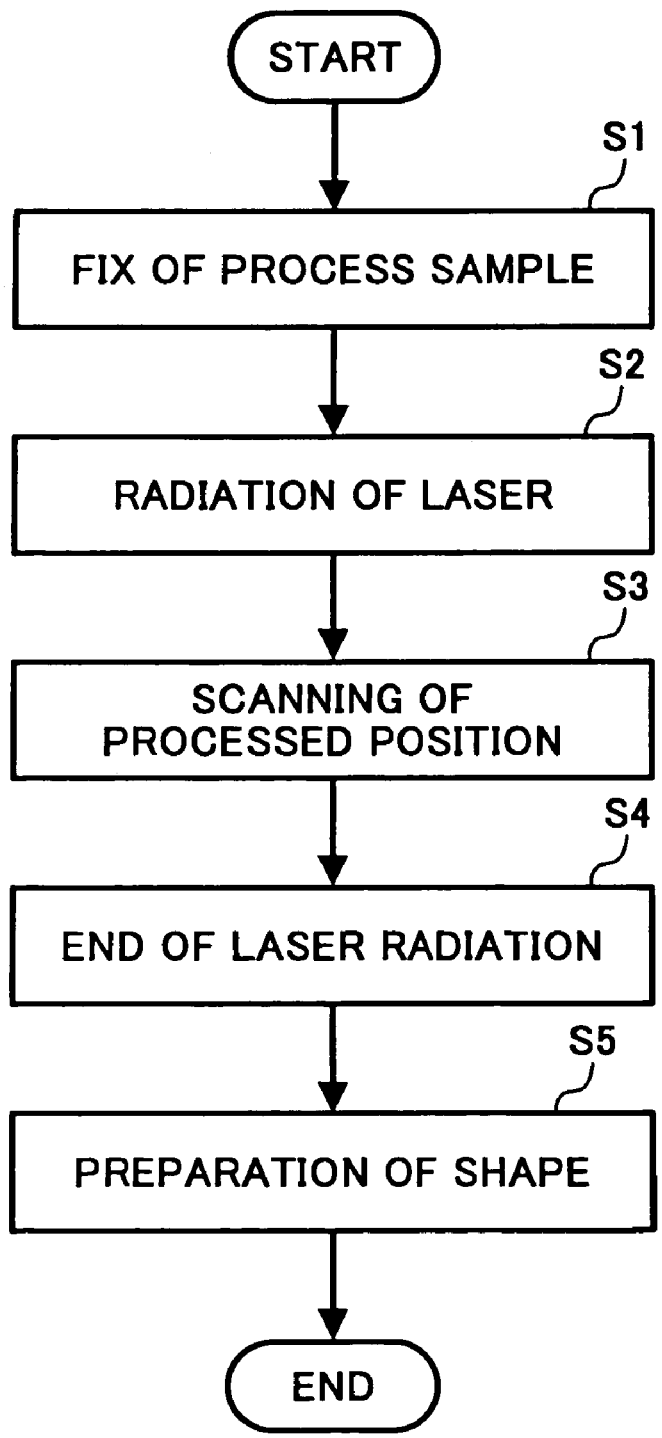
FIG. 19 is a flow chart of controlling the apparatus for processing a three-dimensional structure in the seventeenth embodiment according to the invention.

As shown in FIG. 19, the computer 53 locates the laminate 51 as a process sample in a predetermined position at step S1. Subsequently, the process laser light 32 is emitted from the laser device 31 by controlling the pockels cell 31a at step S2, and by scanning the process position with the galvanometer mirror 54 and fθ lens 56, a removed material section is formed in the laminate 51 at step S3.

Subsequently, the laser radiation is ended at step S4 and then the formation of the profile is ended at step S5.

Eighteenth Embodiment

In this embodiment, a three-dimensional structure having partial flat surfaces, which is formed by the laser process method according to one of the above-mentioned embodiments, is used. Typically, the structure has a process width of sub-micrometer to several hundreds micrometers and a process depth of several nm to several micrometers, and includes a transparent layer and a layer absorbing the process laser light.

Moreover, using a duplicate produced by the method according to one of the above-mentioned embodiments, a three-dimensional structure having the same shape as that of the duplicate can be produced from polymer, glass or the like.

The element produced by this method can be formed in a three-dimensional structure having a flat bottom surface, and, for instance, a transmission type optical element having a depth of order of a light wavelength can be formed.

In conjunction with the above, a micro-sensor and a device for micro-machine can also be produced with the three-dimensional processing according to this embodiment.

In accordance with this embodiment, components can be produced neither by using complicated processes nor by vacuum process, so that large-size components, such as large-sized optical elements, devices having a large area can easily be produced.

Nineteenth Embodiment

By using a three-dimensional structure having a partial flat surface or its duplicate with the laser process method according to one of the above-mentioned embodiments, a component having a reflection layer of Al or the like on at least one surface can be formed by evaporation, sputtering or the like.

The structure has typically a process width of sub-micron to several hundred micrometers and a process depth of several nm to several micrometers as well as at least one reflection layer.

A three-dimensional structure having a flat bottom surface can be provided to a component produced by the method according to this embodiment, and, for instance, a reflection type optical element having a depth of order of a light wavelength can be produced.

In the prior method, complicated process steps are required to form a reflection type optical element. However, in the method according to the present embodiment, a reflection type optical element is formed in a high precision and in a reduced cost by directly processing a three-dimensional structure with a laser light and by applying a reflection layer thereto in the final stage.

While preferred embodiments have been shown and described, various modification and substitutions may be made without departing from the spirit and scope of the invention. Accordingly, it is to be understood that the present invention has been described by way of example, and not by limitation.

[Advantages Resulting from the Invention]

As described above, the following advantages can be obtained by the present invention.

In accordance with the invention defined by the first aspect, a method for processing a three-dimensional structure can be provided, wherein the structure has a fine three-dimensional shape and a flat surface, so that it is usable for an optical device.

In accordance with the invention defined by the second aspect, the thin layer for absorption of laser light has a larger thermal diffusion rate than the flat substrate, and therefore the thin layer for absorption of laser light can be easily separated from the flat substrate.

In accordance with the invention defined by the third aspect, the total thickness of the transparent layer and the thin layer for absorption of laser light removed corresponds to the one-shot pulse radiation, and therefore the process can be carried out at a greater rate, and the depth control can be carried out at a higher precision, compared with those in the conventional laser abrasion method.

In accordance with the invention defined by the fourth aspect, a thermal insulation layer is interposed between the flat substrate and the thin layer for absorption of laser light, the selectable range of the material usable for the flat substrate expands. For instance, a layer having a less flatness can be used as the flat substrate.

In accordance with the invention defined by the fifth aspect, the process depth can be controlled by the number of pulses in the laser light radiation, so that an optical element, such as a multi-binary diffraction optical element, a hologram optical element or the like can easily be produced.

In accordance with the invention defined by the sixth aspect, the thermal diffusion area can be reduced.

In accordance with the invention defined by the seventh aspect, the range controllable for the process depth can be expanded without altering the intensity of the laser light radiation by controlling the thickness of the transparent layer in the initial stage. As a result, the material depth varying in a spatial position can be digitally controlled only by the number of pulses in the laser radiation, and for instance, a phase modulation element or the like can be spatial-selectively formed on a single substrate.

In accordance with the invention defined by the eighth aspect, a process pattern corresponding to a mask pattern can be formed either by projecting a mask pattern in a reduced magnification of imaging or by exposing in a contact with a mask.

In accordance with the invention defined by the ninth aspect, a three-dimensional structure having a varied shape can be formed by changing the radiation position of the process laser light.

In accordance with the invention defined by the tenth aspect, a removed material section having a round bore shape can be formed.

In accordance with the invention defined by the eleventh aspect, a removed material section in the form of a straight line can be formed, so that a diffraction type optical element, a multi-level diffraction element or the like can be produced.

In accordance with the invention defined by the twelfth aspect, a three-dimensional shape product having a material different from the process material can be produced.

In accordance with the invention defined by the thirteenth aspect, a profile is directly formed by using the laser light, and therefore light memory mediums can be produced in a simple process, compared with that in the prior art.

In accordance with the invention defined by the fourteenth aspect, a profile is directly formed, using the laser light, and therefore diffraction optical elements can be produced in a simpler process, compared with that in the prior art.

In accordance with the invention defined by the fifteenth aspect, an apparatus for processing a three-dimensional structure having a fine three-dimensional profile and a flat surface can be provided, where the three-dimensional structure is used as an optical device.

In accordance with the invention defined by the sixteenth aspect, three-dimensional structures having a varied shape can be produced.

In accordance with the invention defined by the seventeenth aspect, three-dimensional structures having a complicated profile can be produced and a wide area process is feasible.

In accordance with the invention defined by the eighteenth aspect, three-dimensional structures having a complicated profile can be produced and a wide area process is feasible.

In accordance with the invention defined by the nineteenth aspect, the thermal diffusion area can be reduced.

In accordance with the invention defined by the twentieth aspect, the process depth can be digitally controlled by the number of laser light radiation pulses, and therefore an optical element, such as a multi-binary diffraction optical element, a hologram optical element or the like, can be produced.

In accordance with the invention defined by the twenty-first aspect, a three-dimensional structure having a fine three-dimensional profile and a flat surface can be obtained, where the three-dimensional structure is used as an optical device.

In accordance with the invention defined by the twenty-second aspect, the thin layer for absorption of laser light has a larger thermal diffusion rate at a depth of a laser light being incident just thereon than at a greater depth, so that the removal of the thin layer for absorption of laser light from the interface is promoted.

In accordance with the invention defined by the twenty-third aspect, the thin layer for absorption of laser light has a higher thermal diffusion rate than the flat substrate and therefore the separation of the thin layer for absorption of laser light from the flat substrate is promoted.

In accordance with the invention defined by the twenty-fourth aspect, a thermal isolation layer is interposed between the flat substrate and the thin layer for absorption of laser light, so that a selectable range of material suitable for the flat substrate expands. For example, a material having unevenness can be used as a material for the flat substrate.

In accordance with the invention defined by the twenty-fifth aspect, an optical element, such as a multi-binary diffraction optical element, a hologram optical element or the like can be obtained.

In accordance with the invention defined by the twenty-sixth aspect, a three-dimensional structure such as a phase modulation element, whose property varies in accordance with the depth, can be obtained.

In accordance with the invention defined by the twenty-seventh aspect, a metal can easily be applied to a material in the form of a thin film, and advantageously provides a very small production cost.

In accordance with the invention defined by the twenty-eighth aspect, a polymer is used as the material for a transparent layer, so that the transparent layer having a well-controlled layer thickness can be produced with a reduced cost.

In accordance with the invention defined by the twenty-ninth aspect, the process depth can be controlled in a high precision, along with an increase in the amount of removal, so that a high quality process is feasible.

In accordance with the invention defined by the thirtieth aspect, a three-dimensional structure having a various profile can be obtained.

In accordance with the invention defined by the thirty-first aspect, the shaping of the structure is directly carried out by the laser light, thereby enabling a reflection type optical element to be produced in simplified steps, compared with the complicated steps in the prior art.

What is claimed is:

1. A three-dimensional structure comprising:
   a flat substrate having a flat surface;
   a thin layer for absorption of laser light laminated on said flat substrate; and
   a transparent layer laminated on said thin layer,
   wherein a thickness of each of the thin layer and the transparent layer is adjusted so that when process laser light is irradiated on the transparent layer at a laser-irradiated area, the process laser light is absorbed in the thin layer after passing through the transparent layer, and the transparent layer and the thin layer are removed by an energy of the absorbed laser light over all of the laser-irradiated area where the process laser light is irradiated, to expose the flat surface of the flat substrate over all of the laser-irradiated area, and said thin layer for absorption of laser light and said transparent layer are further alternately laminated in a plurality of pairs, and each removed material section has a depth different from each other.

2. A three-dimensional structure as claimed in claim 1, wherein the thicknesses of said transparent layers are different from each other.

3. A three-dimensional structure comprising:
a flat substrate having a flat surface;
a thin layer for absorption of laser light laminated on said flat substrate; and
a transparent layer laminated on said thin layer,
wherein a thickness of each of the thin layer and the transparent layer is adjusted so that when process laser light is irradiated on the transparent layer at a laser-irradiated area, the process laser light is absorbed in the thin layer after passing through the transparent layer, and the transparent layer and the thin layer are removed by an energy of the absorbed laser light at the laser-irradiated area where the process laser light is irradiated, to expose the flat surface of the flat substrate of the laser-irradiated area, and said thin layer for absorption of laser light and said transparent layer are further alternately laminated in a plurality of pairs, and each removed material section has a depth different from each other.

4. A three-dimensional structure as claimed in claim 3, wherein the thicknesses of said transparent layers are different from each other.

* * * * *